US010373661B2

(12) United States Patent
Lee et al.

(10) Patent No.: US 10,373,661 B2
(45) Date of Patent: Aug. 6, 2019

(54) STACKED SEMICONDUCTOR DEVICE AND SYSTEM INCLUDING THE SAME

(71) Applicant: Samsung Electronics Co., Ltd., Suwon-si, Gyeonggi-do (KR)

(72) Inventors: Hae-Suk Lee, Seongnam-si (KR); Reum Oh, Hwaseong-si (KR); Jin-Seong Park, Ulsan (KR); Seung-Han Woo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 105 days.

(21) Appl. No.: 15/479,971

(22) Filed: Apr. 5, 2017

(65) Prior Publication Data

US 2017/0352392 A1 Dec. 7, 2017

(30) Foreign Application Priority Data

Jun. 1, 2016 (KR) .................. 10-2016-0068220

(51) Int. Cl.
*G11C 5/02* (2006.01)
*G11C 5/06* (2006.01)
(Continued)

(52) U.S. Cl.
CPC ............... *G11C 7/222* (2013.01); *G11C 5/02* (2013.01); *G11C 5/025* (2013.01); *G11C 5/06* (2013.01);
(Continued)

(58) Field of Classification Search
CPC .......... G11C 7/222; G11C 7/065; G11C 7/10; G11C 7/1006; G11C 7/1069;
(Continued)

(56) References Cited

U.S. PATENT DOCUMENTS 4,460,955 A * 7/1984 Hattori ..................... G05F 1/44
323/254
5,120,989 A * 6/1992 Johnson ............... H03K 5/1506
327/114
(Continued)

FOREIGN PATENT DOCUMENTS

KR 10-1418519 9/2009

OTHER PUBLICATIONS

Jorgesen, "Top 7 Ways to Create a Quadrature (90 ) Phase Shift," Marki Microwave, Apr. 15, 2015, www.markimicrowave.com/blog/top-7-ways-to-create-a-quadrature-90-phase-shift/.*

*Primary Examiner* — Michelle M Koeth
(74) *Attorney, Agent, or Firm* — Harness, Dickey & Pierce, P.L.C.

(57) ABSTRACT

A stacked semiconductor device includes a plurality of semiconductor dies stacked in a vertical direction, first and second signal paths, a transmission unit and a reception unit. The first and second signal paths electrically connect the plurality of semiconductor dies, where each of the first signal path and the second signal path includes at least one through-substrate via. The transmission unit generates a first driving signal and a second driving signal in synchronization with transitioning timing of a transmission signal to output the first driving signal to the first signal path and output the second driving signal to the second signal path. The reception unit receives a first attenuated signal corresponding to the first driving signal from the first signal path and receives a second attenuated signal corresponding to the second driving signal from the second signal path to generate a reception signal corresponding to the transmission signal.

18 Claims, 17 Drawing Sheets

(51) Int. Cl.
*G11C 7/06* (2006.01)
*G11C 7/10* (2006.01)
*H04L 7/033* (2006.01)
*H03K 19/21* (2006.01)
*G11C 7/22* (2006.01)
*G11C 7/12* (2006.01)
*H03K 3/356* (2006.01)
*H01L 25/065* (2006.01)

(52) U.S. Cl.
CPC .............. *G11C 5/063* (2013.01); *G11C 7/065* (2013.01); *G11C 7/10* (2013.01); *G11C 7/1006* (2013.01); *G11C 7/1069* (2013.01); *G11C 7/1096* (2013.01); *G11C 7/12* (2013.01); *H01L 25/0657* (2013.01); *H03K 3/356104* (2013.01); *H03K 19/21* (2013.01); *H04L 7/033* (2013.01); *H01L 2224/16225* (2013.01); *H01L 2225/06544* (2013.01); *H03K 3/356156* (2013.01)

(58) Field of Classification Search
CPC ........... G11C 7/1096; G11C 7/12; G11C 5/02; G11C 5/025; G11C 5/06; G11C 5/063; H01L 25/0657; H01L 2224/16225; H01L 2224/06544; H03K 3/356104; H03K 19/21; H03K 3/356156; H04L 7/033
See application file for complete search history.

(56) References Cited

U.S. PATENT DOCUMENTS

| | | | |
|---|---|---|---|
| 5,945,857 A * | 8/1999 | Havens | H03K 5/1565 |
| | | | 327/134 |
| 6,437,613 B2 | 8/2002 | Shim et al. | |
| 7,598,786 B2 | 10/2009 | Cheng | |
| 8,243,485 B2 | 8/2012 | Jin et al. | |
| 8,410,816 B1 * | 4/2013 | Liu | H03K 19/01852 |
| | | | 326/68 |
| 8,823,162 B2 | 9/2014 | Foster, Sr. et al. | |
| 9,076,770 B2 | 7/2015 | Foster, Sr. et al. | |
| 9,852,806 B2 * | 12/2017 | Stauffer | G11C 5/04 |
| 2013/0182816 A1 | 7/2013 | Skripek | |

* cited by examiner

STACKED SEMICONDUCTOR DEVICE AND SYSTEM INCLUDING THE SAME

CROSS-REFERENCE TO RELATED APPLICATION

This U.S. Non-provisional application claims priority under 35 USC § 119 to Korean Patent Application No. 10-2016-0068220, filed on Jun. 1, 2016, in the Korean Intellectual Property Office (KIPO), the disclosure of which is incorporated by reference in its entirety herein.

BACKGROUND

1. Technical Field

Example embodiments relate generally to semiconductor integrated circuits. For example, at least some example embodiments relate to a stacked semiconductor device and/or a system including the stacked semiconductor device.

2. Discussion of the Related Art

More circuits are integrated in a limited area for high capacity, miniaturization, high operation speed, etc. For example, memory capacity and speed of main memory are increased according to increasing speed of hardware and increasing complexity of software. A plurality of semiconductor dies may be stacked in a package of a memory chip to increase the memory capacity with the same area. As the number of the stacked semiconductor dies is increased, load of a signal path may increase. The increased load of the signal path may degrade speed and/or reliance of signal transfer between the stacked semiconductor dies or between a semiconductor die and an external device.

SUMMARY

Some example embodiments may provide a stacked semiconductor device capable of performing an efficient signal transfer between stacked semiconductor dies.

Some example embodiments may provide a system including a stacked semiconductor device capable of performing an efficient signal transfer between stacked semiconductor dies.

According to example embodiments, a stacked semiconductor device includes a plurality of semiconductor dies stacked in a vertical direction, a first signal path, a second signal path, a transmission unit and a reception unit. The first signal path and the second signal path electrically connect the plurality of semiconductor dies, where each of the first signal path and the second signal path includes at least one through-substrate via (TSV). The transmission unit generates a first driving signal and a second driving signal in synchronization with transitioning timing of a transmission signal to output the first driving signal to the first signal path and output the second driving signal to the second signal path. The reception unit receives a first attenuated signal corresponding to the first driving signal from the first signal path and receives a second attenuated signal corresponding to the second driving signal from the second signal path to generate a reception signal corresponding to the transmission signal.

According to example embodiments, a system includes, a base substrate, a plurality of semiconductor dies stacked on the base substrate in a vertical direction, a first signal path and a second signal path electrically connecting the plurality of semiconductor dies, each of the first signal path and the second signal path including at least one through-substrate via (TSV), a transmission unit configured to generate a first driving signal and a second driving signal in synchronization with transitioning timing of a transmission signal to output the first driving signal to the first signal path and output the second driving signal to the second signal path and a reception unit configured to receive a first attenuated signal corresponding to the first driving signal from the first signal path and receive a second attenuated signal corresponding to the second driving signal from the second signal path to generate a reception signal corresponding to the transmission signal.

According to example embodiments, a stacked semiconductor device includes a first semiconductor die including a first transceiver, the first transceiver configured to transmit a first driving signal and a second driving signal to a first through-substrate via (TSV) and a second through-substrate via (TSV), respectively, the first driving signal and the second driving signal being based on a transmission signal; and a second semiconductor die connected to the first semiconductor die via the first TSV and the second TSV, the second semiconductor device including a second transceiver, the second transceiver configured to receive attenuated versions of the first driving signal and the second driving signal via the first TSV and the second TSV, respectively, and to generate a reception signal based on the attenuated versions of the first driving signal and the second driving signal such that a duty cycle of the reception signal is same as a duty cycle of the transmission signal.

The stacked semiconductor device, the system including the stacked semiconductor device and the method of transferring a signal according to example embodiments may perform a signal transfer efficiently even when the load of the signal path including the TSV is large, by transforming the transmission signal to the two driving signals to be transferred through the two signal paths. The stacked semiconductor device, the system including the stacked semiconductor device and the method of transferring a signal according to example embodiments may maintain the pulse width and the duty ratio of the transmission signal and the reception signal even when the pulse width of the transmission signal is narrow or the frequency of the transmission is small.

BRIEF DESCRIPTION OF THE DRAWINGS

Example embodiments of the present disclosure will be more clearly understood from the following detailed description taken in conjunction with the accompanying drawings.

DETAILED DESCRIPTION

Figure 1:
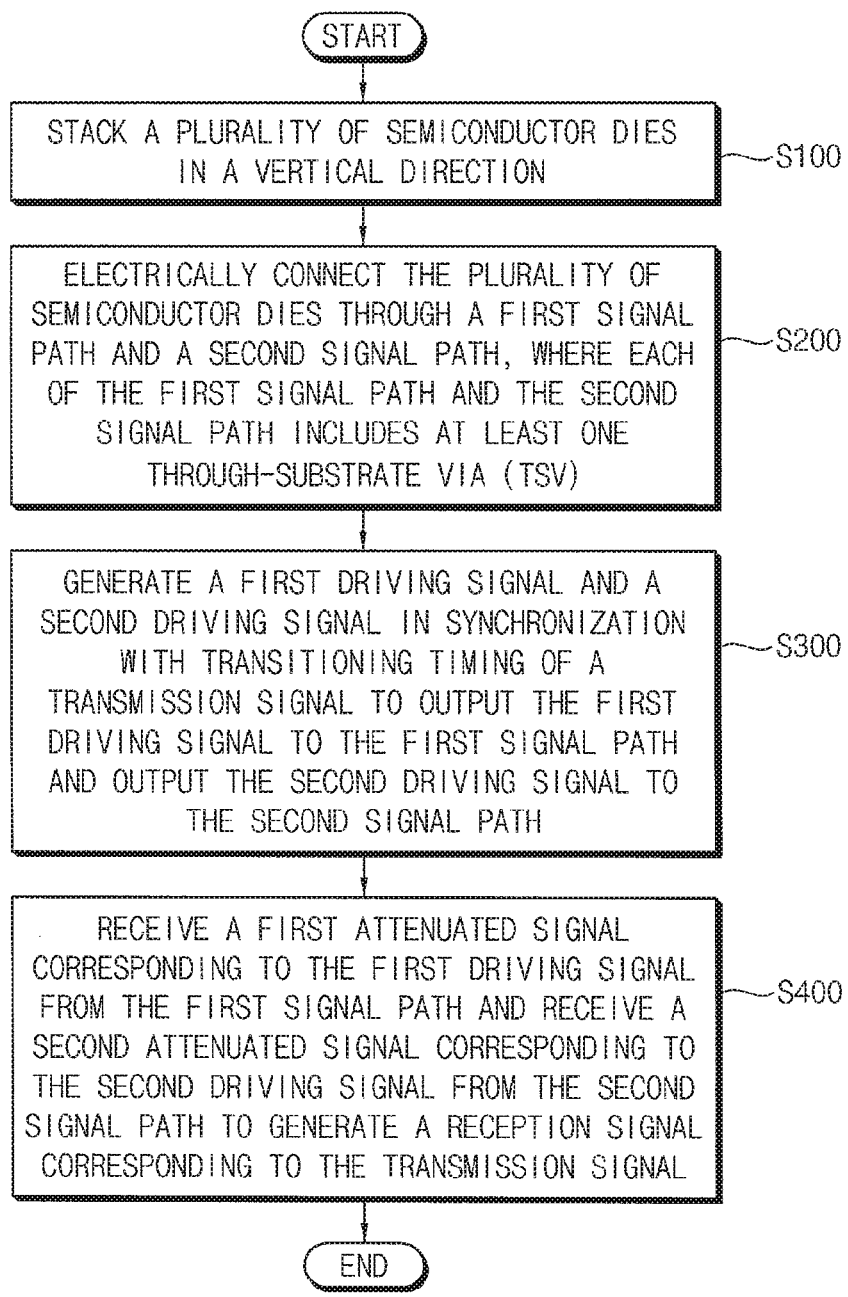
FIG. 1 is a flow chart illustrating a method of transferring signal in a stacked semiconductor device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flow chart illustrating a method of transferring signal in a stacked semiconductor device according to example embodiments.

Referring to FIG. 1, in operation S100, a plurality of semiconductor dies are stacked in a vertical direction. In operation S200, the plurality of semiconductor dies are electrically connected through a first signal path and a second signal path where each of the first signal path and the second signal path includes at least one through-substrate via (TSV).

The stacking and electrically connecting of the semiconductor dies will be described below with reference to FIGS. 2 and 3.

In operation S300, a first driving signal and a second driving signal are generated in synchronization with transitioning timing of a transmission signal to output the first driving signal to the first signal path and output the second driving signal to the second signal path. In operation S400, a first attenuated signal corresponding to the first driving signal is received from the first signal path and second attenuated signal corresponding to the second driving signal is received from the second signal path to generate a reception signal corresponding to the transmission signal.

In some example embodiments, the signal transfer through the first signal path and the second signal path may be performed between two different semiconductor dies. The signal transfer through the first signal path and the second signal path will be described below with reference to FIG. 4.

In a typical stacked semiconductor device, one signal is transmitted or received through one TSV from one semiconductor die to another semiconductor die. As the number of the semiconductor dies sharing the signal path including the TSV is increased, the load of the signal path is increased. Particularly, when a TSV driver is coupled to the TSV for driving the TSV, the load of the signal path is further increased because the junction capacitance of the TSV driver is added to the capacitance of the TSV itself. If the load of the signal path is increased too much, the rising time and the falling time of the signal transferred through the TSV may increase such that the signal may not be transferred normally.

To solve such problems, the method of transferring a signal according to example embodiments may perform a signal transfer efficiently even when the load of the signal path including the TSV is large, by transforming the transmission signal to at least the two driving signals to be transferred through at least the two signal paths. The pulse width and the duty ratio of the transmission signal and the reception signal may be maintained even when the pulse width of the transmission signal is narrow or the frequency of the transmission is small.

Figure 2:
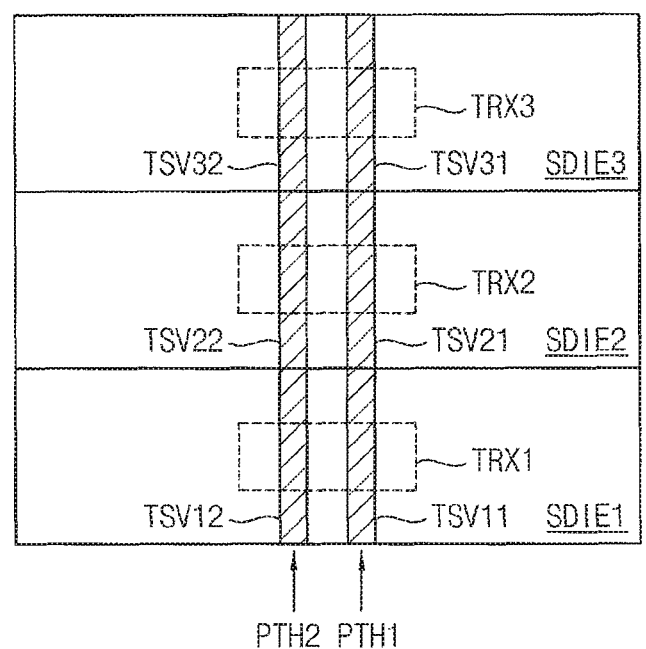
FIGS. 2, 3 and 4 are diagrams illustrating a stacked semiconductor device according to example embodiments.
Figure 3:
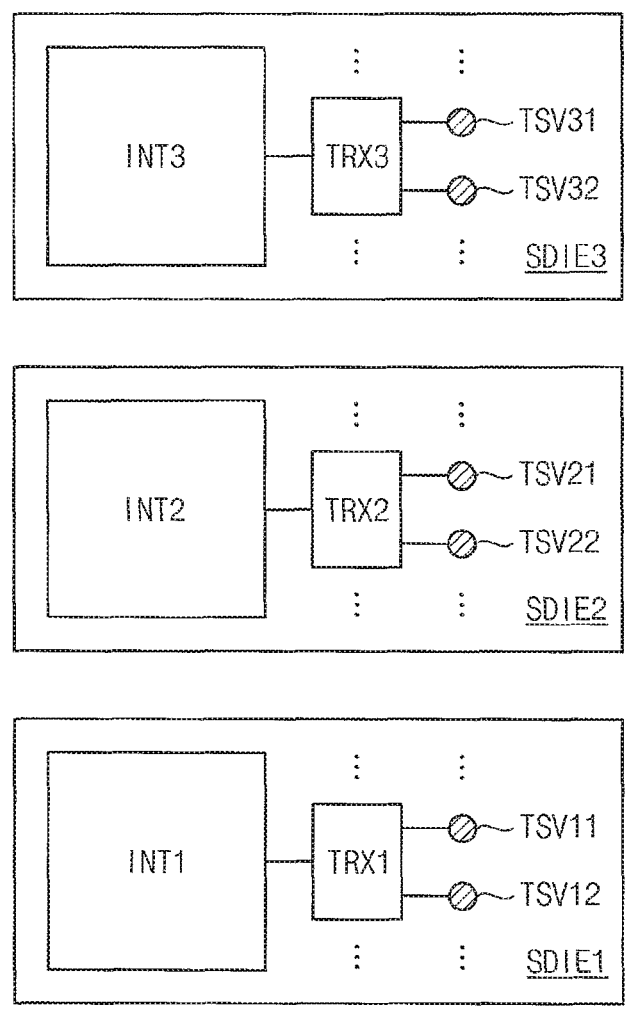
Figure 4:
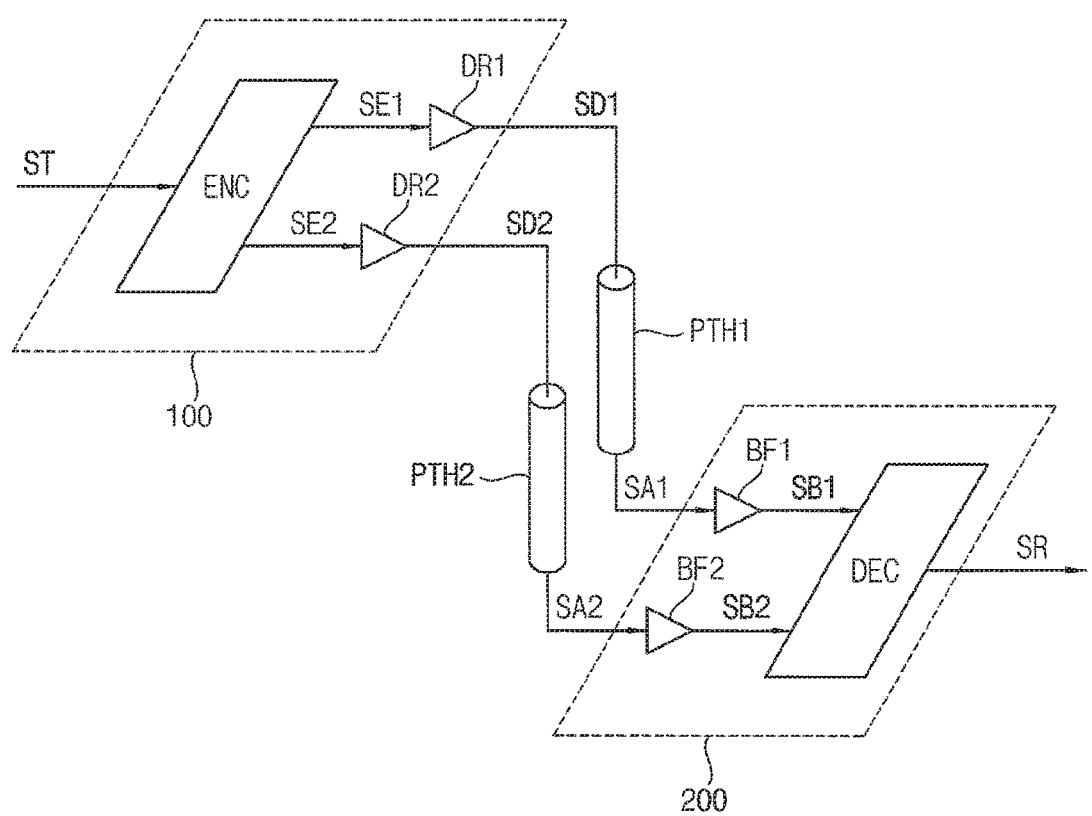

FIGS. 2, 3 and 4 are diagrams illustrating a stacked semiconductor device according to example embodiments.

FIGS. 2 and 3 illustrate a stack structure of a stacked semiconductor device and FIG. 4 illustrates a configuration for signal transfer included in a stacked semiconductor device.

Referring to FIGS. 2 and 3, a stacked semiconductor device 10 includes a plurality of semiconductor dies SDIE1, SDIE2 and SDIE3 that are stacked in a vertical direction. FIG. 2 illustrates an example vertical structure in a stacked state of the semiconductor dies SDIE1, SDIE2 and SDIE3, and FIG. 3 illustrates an example horizontal structure in a non-stacked state of the semiconductor dies SDIE1, SDIE2 and SDIE3. FIGS. 2 and 3 illustrate a non-limiting example of the three stacked semiconductor dies SDIE1, SDIE2 and SDIE3, and the number of the stacked semiconductor dies may be determined variously.

The semiconductor dies SDIE1, SDIE2 and SDIE3 may include internal circuits INT1, INT2 and INT3, transceiver units TRX1, TRX2 and TRX3 and through-silicon vias or through-substrate vias TSV11, TSV12, TSV21, TSV22, TSV31 and TSV32, respectively. FIGS. 2 and 3 illustrate a non-limiting example that each semiconductor die includes one transceiver unit and two through-substrate vias for transferring one signal, and the numbers of the transceiver units and the through-substrates vias included in each semiconductor die may be determined variously.

Each of signal paths PTH1 and PTH2 includes one or more through-substrate vias that are formed in the semiconductor dies SDIE1, SDIE2 and SDIE3, respectively. For example, as illustrated in FIG. 2, the first signal path PTH1 may include the three through-substrate vias TSV11, TSV21 and TSV31 respectively formed in the three semiconductor dies SDIE1, SDIE2 and SDIE3, and the second signal path PTH2 may include the three through-substrate vias TSV21, TSV22 and TSV32 respectively formed in the three semiconductor dies SDIE1, SDIE2 and SDIE3. Even though FIG. 2 illustrates that the two through-substrate vias in the adjacent semiconductor dies are connected directly, the through-substrate vias may be electrically connected through bumps, pads, metal wires, etc.

Each transceiver unit TRXi (i=, 1, 2, 3) may receive one transmission signal from the internal circuit INTi and convert or encode the one transmission signal to two signals to be transmitted to the first signal path PTH1 and the second signal path PTH2. In addition, each transceiver unit TRXi may receive two signals from the first signal path PTH1 and the second signal path PTH2 and decode the two signals to one reception signal to be provided to the internal circuit INTi. Such signal transfer will be further described below with reference to FIGS. 4 through 13.

The internal circuit INTi may include various integrated circuits according to the kind of the stacked semiconductor device 10. For example, if the stacked semiconductor device 10 is a memory device, memory cells and circuits for operating the memory cells may be integrated in the internal circuit INTi. The semiconductor dies SDIE1, SDIE2 and SDIE3 may be homogeneous or heterogeneous. Even though FIGS. 2 and 3 illustrate only the configuration for signal transfer according to example embodiments, the stacked semiconductor device 10 may further include the configuration for the conventional signal transfer, that is, the configuration for transferring one signal through one signal path.

Referring to FIG. 4, a stacked semiconductor device 11 includes a transmission unit 100, a first signal path PTH1, a second signal path PTH2 and a reception unit 200. The transmission unit 100 and the reception unit 200 may be included in the transceiver units TRX1, TRX2 and TRX3 in FIGS. 2 and 3, respectively.

For example, to perform an interlayer signal transfer, the transmission unit 100 may be included in one of the semiconductor dies SDIE1, SDIE2 and SDIE3 and the reception unit 200 may be included in another of the semiconductor dies SDIE1, SDIE2 and SDIE3. As described above with reference to FIGS. 2 and 3, each of the first signal path PTH1 and the second signal path PTH2 may include at least one through-substrate via for the signal transfer between the semiconductor dies SDIE1, SDIE2 and SDIE3.

The transmission unit 100 generates a first driving signal SD1 and a second driving signal SD2 in synchronization with transitioning timing of a transmission signal ST to output the first driving signal SD1 to the first signal path PTH1 and output the second driving signal SD2 to the second signal path PTH2. In other words, the transmission unit 100 drives the first signal path PTH1 and the second signal path PTH2 with the first driving signal SD1 and the second driving signal SD2, respectively. The reception unit 200 receives a first attenuated signal SA1 corresponding to the first driving signal SD1 from the first signal path PTH1 and receives a second attenuated signal SA2 corresponding to the second driving signal SD2 from the second signal path PTH2. The reception unit 200 generates a reception signal SR corresponding to the transmission signal ST based on the first attenuated signal SA1 and the second attenuated signal SA2.

The transmission unit 100 includes an encoder ENC, a first driver DR1 and a second driver DR2. The encoder ENC generates a first encoder signal SE1 and a second encoder signal SE2 in synchronization with the transitioning timing of the transmission signal ST. The first driver DR1 generates the first driving signal SD1 based on the first encoder signal SE1. The second driver DR2 generates the second driving signal SD2 based on the second encoder signal SE2. In some example embodiments, as will be described below with reference to FIGS. 5 through 9, the encoder ENC may be implemented with flip-flops that generate signals toggling in synchronization with edges of the transmission signal ST.

The reception unit 200 includes a first reception buffer BF1, a second reception buffer BF2 and a decoder DEC. The first reception buffer BF1 buffers the first attenuated signal SA1 to generate a first buffer signal SB1. The second reception buffer BF2 buffers the second attenuated signal SA2 to generate a second buffer signal SB2. The decoder DEC generates the reception signal SR based on the first buffer signal SB1 and the second buffer signal SB2. In some example, embodiments, as will be described below with reference to FIGS. 10 and 11, the decoder DEC may be implemented with a logic gate that performs a logic operation on the first buffer signal SB1 and the second buffer signal SB2.

The first driver DR1 and the second driver DR2 may be omitted or included in the encoder ENC. In this case, the first encoder signal SE1 may be the same as the first driving signal SD1 and the second encoder signal SE2 may be the same as the second driving signal SD2.

In addition, the first reception buffer BF1 and the second reception buffer BF2 may be omitted or included in the decoder DEC. In this case, the decoder DEC may directly receive the first attenuated signal SA1 and the second attenuated signal SA2 and generate the reception signal SR based on the first attenuated signal SA1 and the second attenuated signal SA2.

As such, the stacked semiconductor device according to example embodiments may perform a signal transfer efficiently even when the load of the signal path including the TSV is large, by transforming the transmission signal to the two or more driving signals to be transferred through the two or more signal paths. The stacked semiconductor device according to example embodiments may maintain the pulse width and the duty ratio of the transmission signal and the reception signal even when the pulse width of the transmission signal is narrow or the frequency of the transmission is small.

Figure 5:
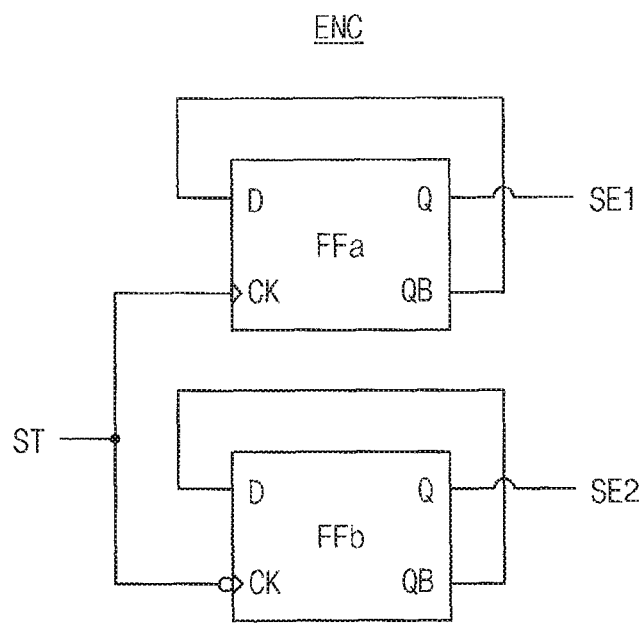
FIG. 5 is a diagram illustrating an example embodiment of an encoder included in the stacked semiconductor device of FIG. 4.
Figure 6:
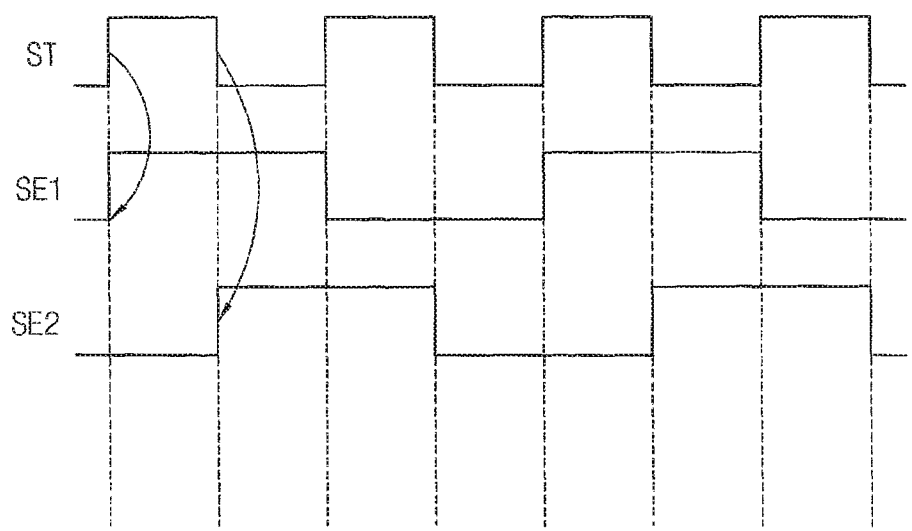
FIG. 6 is a timing diagram illustrating an operation of a transmission unit including the encoder of FIG. 5.

FIG. 5 is a diagram illustrating an example embodiment of an encoder included in the stacked semiconductor device of FIG. 4, and FIG. 6 is a timing diagram illustrating an operation of a transmission unit including the encoder of FIG. 5.

Referring to FIG. 5, an encode ENC may include a first flip-flop FFa and a second flip-flop FFb.

The first flip-flop FFa may have a clock terminal CK receiving the transmission signal ST, a data terminal D and an inversion output terminal QB connected to each other, and a non-inversion output terminal Q outputting the first encoder signal SE1.

The second flip-flop FFb may have a clock terminal CK receiving an inversion signal of the transmission signal ST, a data terminal D and an inversion output terminal QB connected to each other, and a non-inversion output terminal Q outputting the second encoder signal SE2.

In some example embodiments, the first flip-flop FFa may be implemented with a rising-edge-triggered D flip-flop and the second flip-flop FFb may be implemented with a falling-edge-triggered flip-flop. The rising-edge-triggered D flip-flop and the falling-edge-triggered flip-flop will be described below with reference to FIGS. 7, 8 and 9.

Referring to FIGS. 5 and 6, the first flip-flop FFa may generate the first encoder signal SE1 toggling in synchronization with the rising edges of the transmission signal ST. The second flip-flop FFb may generate the second encoder signal SE2 toggling in synchronization with the falling edges of the transmission signal ST.

As illustrated in FIG. 6, the transmission signal ST may be a clock signal having a desired (or, alternatively, a predetermined) frequency and a desired (or, alternatively, a predetermined) duty ratio. In some example embodiments, the transmission signal ST may be a data strobe signal. Each of the stacked semiconductor dies may perform a signal transfer between the semiconductor dies or between the semiconductor die and an external device in synchronization with the data strobe signal. In this case, the first encoder signal SE1 and the second encoder signal SE2 may have the phase difference of 90 degrees and the frequency of the first and second encoder signals SE1 and SE2 may be half of the frequency of the transmission signal ST. In other words, the frequency of the first and second driving signals SD1 and SD2 may be half of the frequency of the transmission signal ST.

Figure 7:
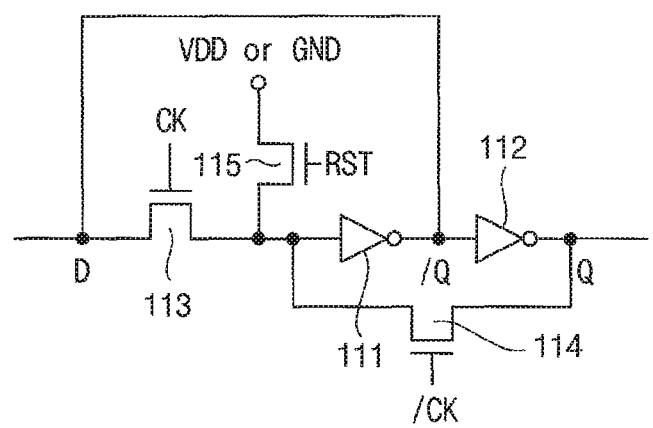
FIGS. 7, 8 and 9 are diagrams illustrating example embodiments of flip-flops included in the encoder of FIG. 5.
Figure 8:
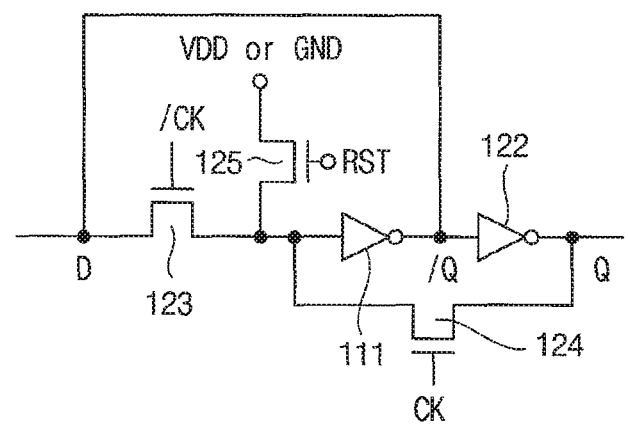
Figure 9:
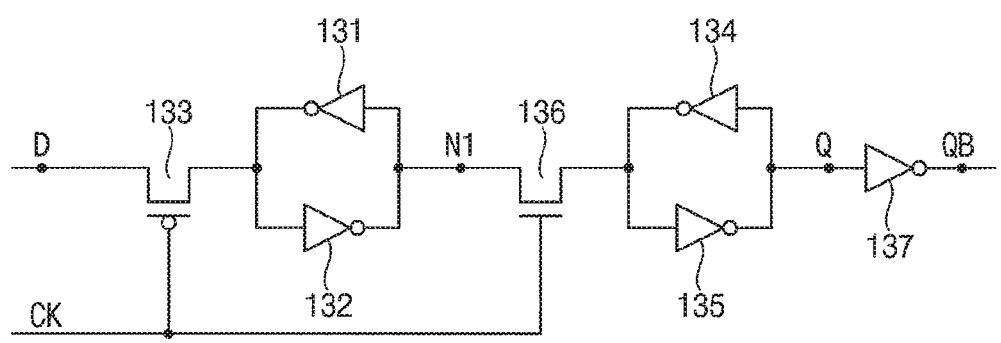

FIGS. 7, 8 and 9 are diagrams illustrating example embodiments of flip-flops included in the encoder of FIG. 5.

FIG. 7 illustrates an example of a positive-edge triggered flip-flop or a rising edge triggered flip-flop and FIG. 8 illustrates an example of a negative-edge triggered flip-flop or a falling-edge triggered flip-flop. The non-limiting example configuration of the flip-flops in FIGS. 7 and 8 are presented for describing the toggling operation of the encoder ENC, and the configuration of the flip-flops may be changed variously.

Referring to FIG. 7, the positive-edge triggered flip-flop may include a first inverter 111, a second inverter 112, a first switch 113 and a second switch 114.

The output of the first inverter 111 is coupled to the input of the second inverter 112, and the output of the second inverter 112 is coupled to the input of the first inverter 111 via the second switch 114, thereby forming a latch configuration. In the example of FIG. 7, the output of the first inverter 111 corresponds to an inversion output terminal /Q and the output of the second inverter 112 corresponds to a non-inversion output terminal Q. The first switch 113 is coupled between a data terminal D and the input of the first inverter 111 and the control terminal CK of the first switch 113 corresponds to a clock terminal. A clock signal CLK is applied to the control terminal CK of the first switch 113 and an inversion signal /CLK of the clock signal CLK is applied to the control terminal /CK of the second switch 114.

The positive-edge triggered flip-flop of FIG. 7 may further include a reset switch 115 for initializing a state of the flip-flop. When the reset switch 115 is turned on in response to a reset signal RST, the inversion output terminal /Q and the output terminal Q may be initialized respectively to logic low or logic high depending on the reset voltage VDD or GND.

When the clock signal CLK applied to the control terminal CK is logic low, the flip-flop of FIG. 7 is in a storage state that does not change even though the logic level of the data terminal D is changed. When the clock signal CLK transitions from logic low to logic high, that is, at the rising edge of the clock signal CLK, the logic level of the data terminal D is transferred into the non-inversion output terminal Q. The flip-flop such that the logic state is determined in synchronization with the edge of the signal applied to the clock terminal CK is referred to as an edge triggered flip-flop, and the flip-flop of FIG. 7 corresponds to a positive-edge triggered flip-flop.

The positive-edge triggered flip-flop may perform toggling when the inversion output terminal /Q is coupled to the data terminal D. When the clock signal CLK applied to the control terminal CK transitions to logic low, the second switch 114 is turned on and the data terminal D is set to logic level opposite to the non-inversion output terminal Q but the state of the flip-flop is not changed since the first switch 113 is turned off. When the clock signal CLK transitions to logic high, the first switch 113 is turned on and logic level of the inversion output terminal is applied to the input of the first inverter 111, thereby inverting the logic state of the non-inverting output terminal Q. As such, the positive-edge triggered flip-flop performs toggling by inverting the storage state from logic high to logic low or from logic low to logic high at each rising edge of the clock signal CLK applied to the control terminal CK.

Referring to FIG. 8, the negative-edge triggered flip-flop has a configuration similar to the positive-edge triggered flip-flop of FIG. 7, but the inversion signal /CLK of the clock signal CLK is applied to the control gate /CK of the first switch 123 and the clock signal CLK is applied to the control gate CK of the second switch 124. That is, the flip-flops of FIGS. 7 and 8 are different in that the control terminals CK and /CK are exchanged.

The negative-edge triggered flip-flop of FIG. 8 performs toggling in response to the falling edges of the clock signal CLK whereas the positive-edge triggered flip-flop of FIG. 7 performs toggling in response to the rising edges of the clock signal CLK. When the clock signal CLK applied to the control terminal CK transitions to logic high, the second switch 124 is turned on and the data terminal D is set to logic level opposite to the non-inversion output terminal Q but the state of the flip-flop is not changed since the first switch 123 is turned off. When the clock signal CLK transitions to logic low, the first switch 123 is turned on and logic level of the inversion output terminal is applied to the input of the first inverter 111, thereby inverting the logic state of the non-inverting output terminal Q. As such, the negative-edge triggered flip-flop performs toggling by inverting the storage state from logic high to logic low or from logic low to logic high at each falling edge of the clock signal CLK applied to the control terminal CK.

The encoder ENC may include such positive-edge triggered flip-flops and/or negative-edge triggered flip-flops for generating the first encoder signal SE1 and the second encoder signal SE2 as described above.

Referring to FIG. 9, a D flip-flop may include a first inverter 131, a second inverter 132, a first switch 133, a third inverter 134, a fourth inverter 135, a second switch 136 and a fifth inverter 137.

An output of the first inverter 131 is connected to an input of the second inverter 132 and an output of the second inverter 132 is connected to an input of the first inverter 131 to have a latch configuration. An output of the third inverter 134 is connected to an input of the fourth inverter 135 and an output of the fourth inverter 135 is connected to an input of the third inverter 134 to have a latch configuration.

In the example of FIG. 9, the output of the fifth inverter 137 corresponds to the inversion output terminal QB and the output of the fourth inverter 135 corresponds to the non-inversion output terminal Q. The first switch 133 is connected between the data terminal D and the input of the second inverter 132 and control terminal of the first switch 133 corresponds to the clock terminal CK. The clock signal CLK is applied to the control terminals CK of the first switch 133 and the second switch 136.

In FIG. 9, the first switch 133 is a PMOS type and the second switch 136 is a NMOS type. In this case, the D flip-flop corresponds to a rising-edge-triggered D flip-flop.

When the clock signal CLK applied to the control terminal CK is the logic low level, the output of the D flip-flop of FIG. 9 is the value of the previous data, that is, the D flip-flop is in a memory state. In the memory state, the output is not changed though the logic value at the data terminal D is changed. The value of the data terminal D is inverted by the second inverter 132 to transfer the inverted value to the output node N1 but the inverted value is not transferred to the output terminals Q and QB of the D flip-flop 40 because the second switch 136 is turned off.

When the clock signal CLK transitions to the logic high level, that is, at the rising edge of the clock signal CLK, the value at the output node N1 of the second inverter 132 is latched by the first inverter 131 and the second inverter 132 when the first switch 133 is turned off. The value at the output node N1 is transferred through the second switch 136 and inverted again by the fourth inverter 135. Thus the data value triggered at the rising edge of the clock signal CLK is transferred to the non-inversion output terminal Q and the inverted data value is transferred to the inversion output terminal QB.

When the clocks signal CLK transitions to the logic low level, that is, at the falling edge of the clock signal CLK, the second switch 136 is turned off and the previous output value is latched by the third inverter 134 and the fourth inverter 135 and stored in the output terminals Q and QB. At the same time, the first switch 133 is turned on and the inverted value of the new data is transferred by the second inverter 132 to the output node N1.

The flip-flop having the logic state changing in synchronization with the edge of the signal applied to the control terminal CK may be referred to as an edge-triggered flip-flop. The D flip-flop of FIG. 9 corresponds to a rising-edge triggered D flip-flop. The rising-edge triggered D flip-flop may toggle per rising edge of the clock signal CLK to invert the memory state from the logic high value to the logic low value or from the logic low value to the logic high value.

If the first switch 133 is an NMOS type and the second switch 136 is a PMOS type, the D flip-flop may be implemented as a falling-edge-triggered D flip-flop. Also the falling-edge-triggered D flip-flop may be implemented if the inverted signal is applied to the control terminal instead of changing the types of the switches 133 and 136.

Using such toggling flip-flops, the encoder ENC may be implemented to generate the first encoder signal SE1 and the second encoder signal SE2 as described above.

Figure 10:
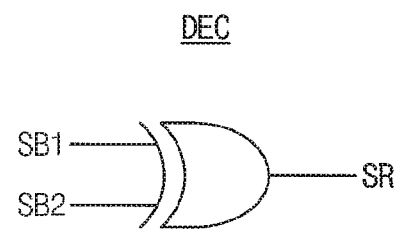
FIG. 10 is a diagram illustrating an example embodiment of a decoder included in the stacked semiconductor device of FIG. 4.
Figure 11:
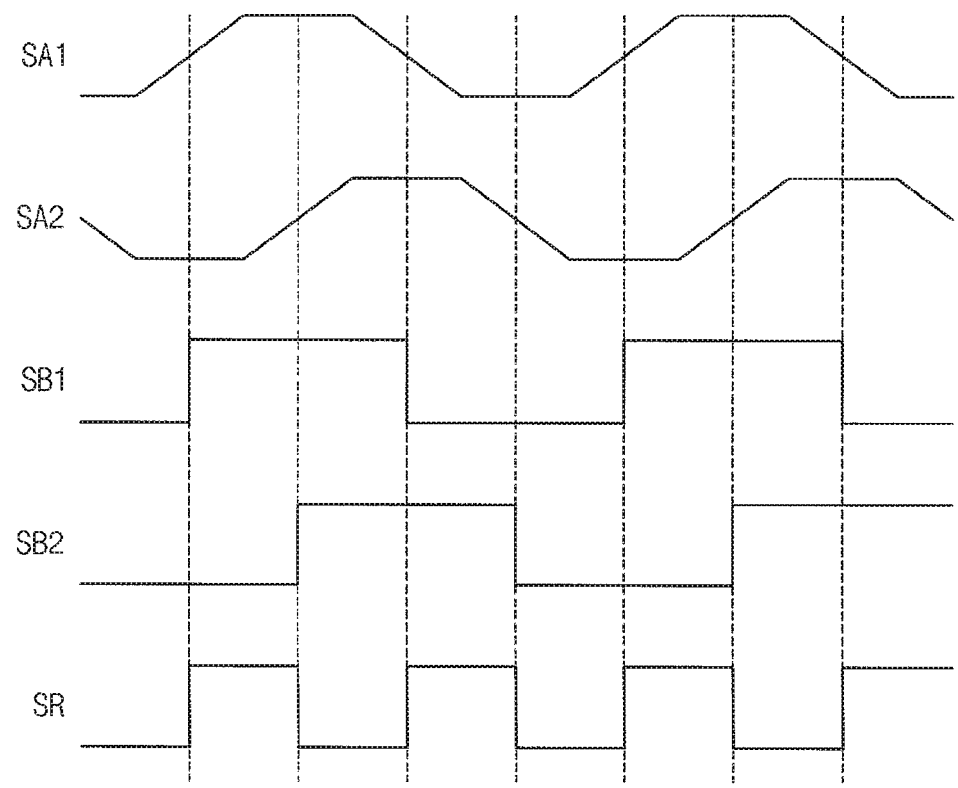
FIG. 11 is a timing diagram illustrating an operation of a reception unit including the decoder of FIG. 10.

FIG. 10 is a diagram illustrating an example embodiment of a decoder included in the stacked semiconductor device of FIG. 4, and FIG. 11 is a timing diagram illustrating an operation of a reception unit including the decoder of FIG. 10.

Referring to FIG. 10, the decoder DEC included in the reception unit 200 in FIG. 4 may be implemented as a logic gate configured to perform an exclusive OR (XOR) logic operation on the first buffer signal SB1 and the second buffer signal SB2 to generate the reception signal SR.

Also the first attenuated signal SA1 and the second attenuated signal SA2 in FIG. 4 are illustrated in FIG. 11. When the reception buffers SB1 and SB2 in FIG. 4 are omitted, the first attenuated signal SA1 and the second attenuated signal SA2 may be input to the decoder DEC instead of the first buffer signal SB1 and the second buffer signal SB2.

The first attenuated signal SA1 and the second attenuated signal SA2 in FIG. 11 correspond to the first encoder signal SE1 and the second encoder signal SE2 in FIG. 6. As described with reference to FIG. 6, the transmission signal ST may be a clock signal having a frequency and a duty ratio, the first and second encoder signals SE1 and SE2 may have a phase difference of 90 degrees, and the frequency of the first and second encoder signals SE1 and SE2 may be half of the frequency of the transmission signal ST. The first and second encoder signals SE1 and SE2 may be used to generate the first and second driving signals SD1 and the second driving signal SD2, which may be attenuated along the first and second signal paths PTH1 and PTH2. As a result, the rising and falling edges of the first and second attenuated signals SA1 and SA2 have slow slopes. In other words, the rising and falling times of the first and second attenuated signals SA1 and SA2 are increase as the loads of the first and second signal paths PTH1 and PTH2 are increased.

The first and second reception buffers BF1 and BF2 in FIG. 4 may buffer the first and second attenuated signals SA1 and SA2 to output the first and second buffer signals SB1 and SB2, respectively. The decoder DEC of FIG. 10 may perform an XOR logic operation on the first and second buffer signal SB1 and SB2 to generate the reception signal SR. As illustrated in FIG. 11, the reception signal SR may have the logic low level when the first and second buffer signal SB1 and SB2 have the same logic levels, and the reception signal SR may have the logic high level when the first and second buffer signal SB1 and SB2 have the different logic levels.

When the transmission signal ST is a clock signal having a desired (or, alternatively, a predetermined) frequency and a desired (or, alternatively, a predetermined) duty ratio, the frequency of the first and second attenuated signals SA1 and SA2 may be half of the frequency of the transmission signal ST. In other words, the frequency of the first and second buffer signals SB1 and SB2 may be half of the frequency of the transmission signal ST. As a result, the frequency of the reception signal SR may have the same frequency as the transmission signal ST.

The delay amounts of the first and second attenuated signals SA1 and SA2 may be determined depending on the capacitances of the first and second signal paths PTH1 and PTH2, and the attenuation amounts of the first and second attenuated signals SA1 and SA2 may be determined depending on the resistances of the first and second signal paths PTH1 and PTH2. The first and second signal paths PTH1 and PTH2 may be implemented to have substantially the same loads according to example embodiments, and the delay amounts and the attenuation amounts of the first and second attenuated signals SA1 and SA2 may be equal to each other. As a result, the duty ratio of the reception signals SR may be equal to the duty ratio of the transmission signal ST.

Figure 12:
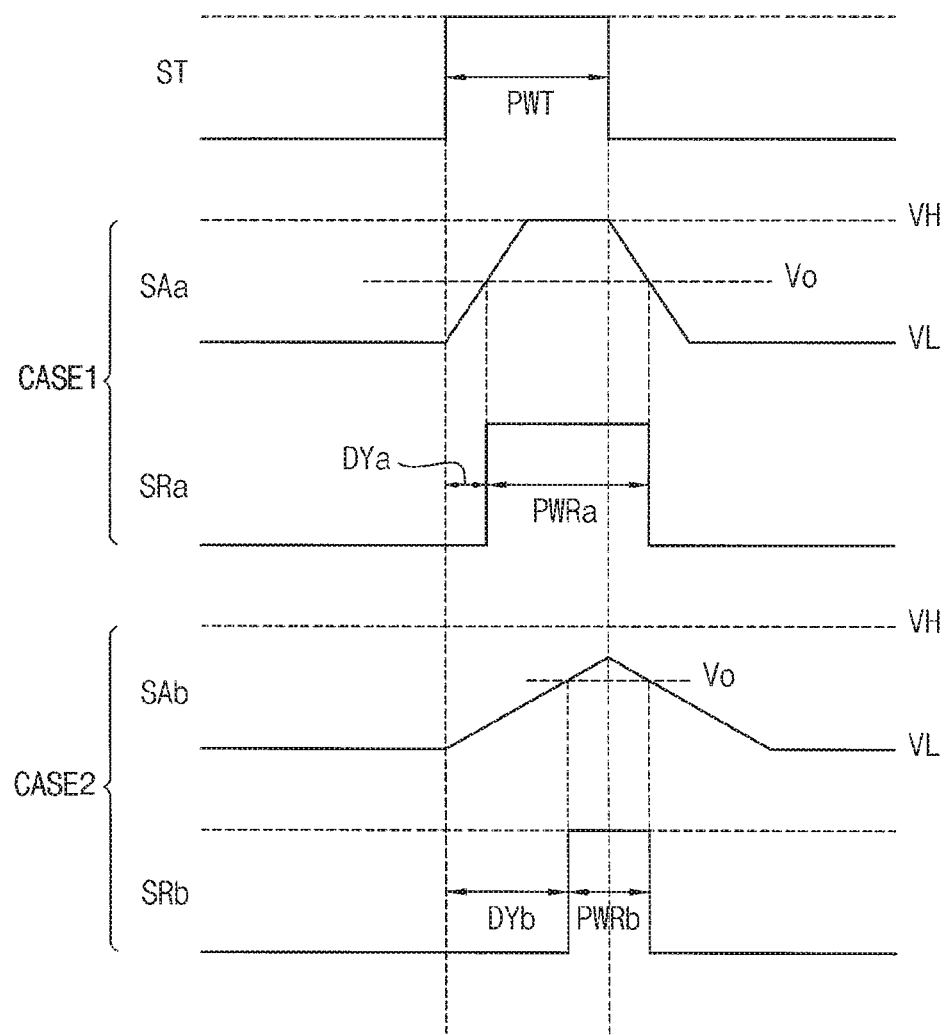
FIG. 12 is a timing diagram illustrating a signal transfer using a single signal path.

FIG. 12 is a timing diagram illustrating a signal transfer using a single signal path.

FIG. 12 illustrates an attenuated signal SAa and a reception signal SRa of a first case CASE1 when the load of the signal path is relatively small, and an attenuated signal SAb and a reception signal SRb of a second case CASE2 when the load of the signal path is relatively large.

In the first case CASE1, the increase of the rising and falling times of the attenuated signal SAa is not serious because the load of the signal path is relatively small, and thus the pulse width PWRa of the reception signal SRa may be maintained to be equal to the pulse width PWT of the transmission signal ST. If the pulse width PWT of the transmission signal ST is large sufficiently, the attenuated signal SAa may swing fully between the high voltage VH and the low voltage VL.

In the second case CASE2, the increase of the rising and falling times of the attenuated signal SAb is serious because the load of the signal path is relatively large, and thus the pulse width PWRb of the reception signal SRb may be reduced to be smaller than the pulse width PWT of the transmission signal ST. If the pulse width PWT of the transmission signal ST is small, the attenuated signal SAb may not swing fully between the high voltage VH and the low voltage VL.

The delay time DYb of the second case CASE2 when the load of the signal path is relatively large is longer than the delay time DYa of the first case CASE1 when the load of the signal path is relatively small. As the load of the signal path is increased, the delay amount and the attenuation amount of the attenuated signal becomes serious and thus the signal may not be transferred normally.

As such, if the signal is transferred using the one signal path, the waveform of the reception signal may be distorted differently from the waveform of the transmission signal and the signal transfer may be impossible in some cases. As the frequency of the transmission signal is increased and/or the load of the signal path is increased, the signal distortion and the malfunction become serious.

Figure 13:
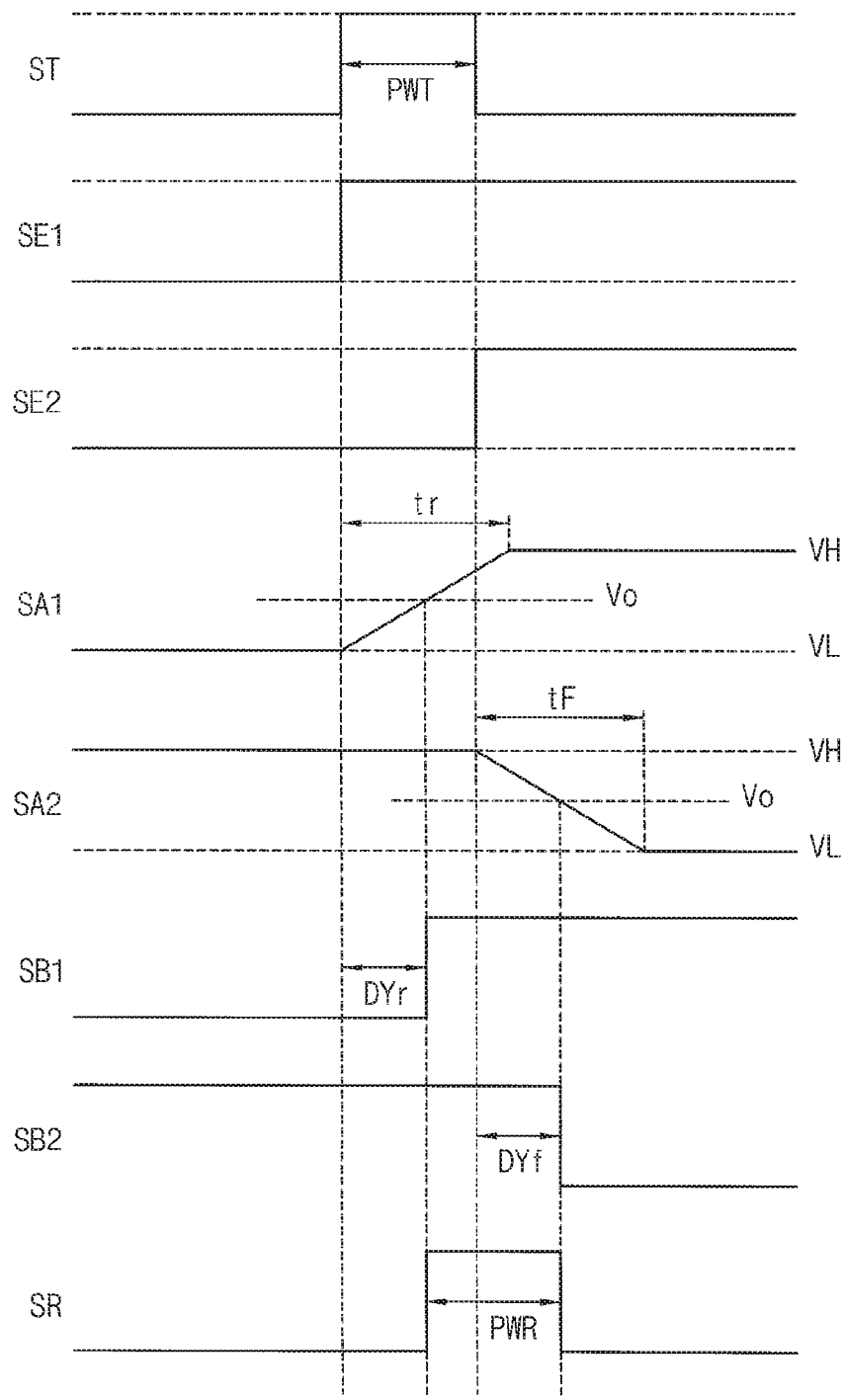
FIG. 13 is a timing diagram illustrating a signal transfer using two signal paths according to example embodiments.

FIG. 13 is a timing diagram illustrating a signal transfer using two signal paths according to example embodiments.

Referring to FIGS. 4, 5, 6, 10, 11 and 13, the encoder ENC of the transmission unit 100 may generate the first encoder signal SE1 toggling in synchronization with the rising edges of the transmission signal ST and the second encoder signal SE2 toggling in synchronization with the falling edges of the transmission signal ST. The encoder ENC may drive the first signal path PTH1 and the second signal path PTH2 using the first encoder signal SE1 and the second encoder signal SE2, respectively.

The reception unit 200 may receive the first attenuated signal SA1 corresponding to the first encoder signal SE1 through the first signal path PTH1 and the second attenuated signal SA2 corresponding to the second encoder signal SE2 through the second signal path PTH2. The rising time tR and the falling time tF of the first and second attenuated signals SA1 and SA2 are increased according to the loads of the first and second signal paths PTH1 and PTH2. If the loads of the signal paths PTH1 and PTH2 are very large, the rising time tR and the falling time tF may be longer than the pulse width PWT of the transmission signal ST. The first and second attenuated signals SA1 and SA2 may swing fully between the high voltage VH and the low voltage VL even if the pulse width PWT of the transmission signal ST is relatively small.

The first and second reception buffers BF1 and BF2 in the reception unit 200 may generate the first and second buffer signals SB1 and SB2 based on the first and second attenuated signals SA1 and SA2. The decoder DEC in the reception unit 200 may perform an XOR logic operation on the first and second buffer signals SB1 and SB2 to generate the reception signal SR. The first and second signal paths PTH1 and PTH2 may be implemented to have substantially the same loads according to example embodiments. In this case, the delay amount and the attenuation amount of the first attenuated signal SA1 may be substantially the same as those of the second attenuated signal SA2. In other words, the delay time DYr of the first buffer signal SB1 may be substantially the same as the delay time DYf of the second buffer signal SB2.

Therefore, the duty ratio of the reception signal SR may be maintained to be equal to the duty ratio of the transmission signal ST. As illustrated in FIG. 13, the reception signal SR may have the same duty ratio as the transmission signal ST even when the rising time tR and the falling time tF of the first and second attenuated signals SA1 and SA2 are longer than the pulse width PWT of the transmission signal ST.

As such, the stacked semiconductor device and the method of transferring a signal according to example embodiments may perform a signal transfer efficiently even when the load of the signal path including the TSV is large, by transforming the transmission signal to the two driving signals to be transferred through the two signal paths. The stacked semiconductor device and the method of transferring a signal according to example embodiments may maintain the pulse width and the duty ratio of the transmission signal and the reception signal even when the pulse width of the transmission signal is narrow or the frequency of the transmission is small.

Figure 14:
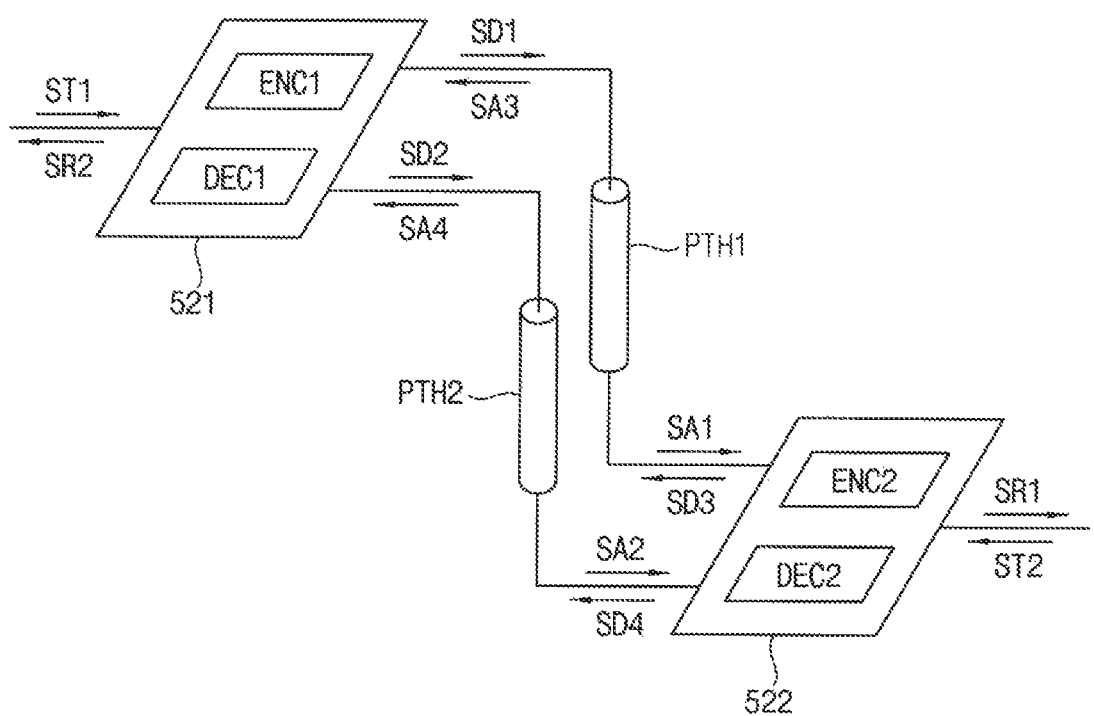
FIGS. 14, 15 and 16 are diagram illustrating stacked semiconductor devices according to example embodiments.
Figure 15:
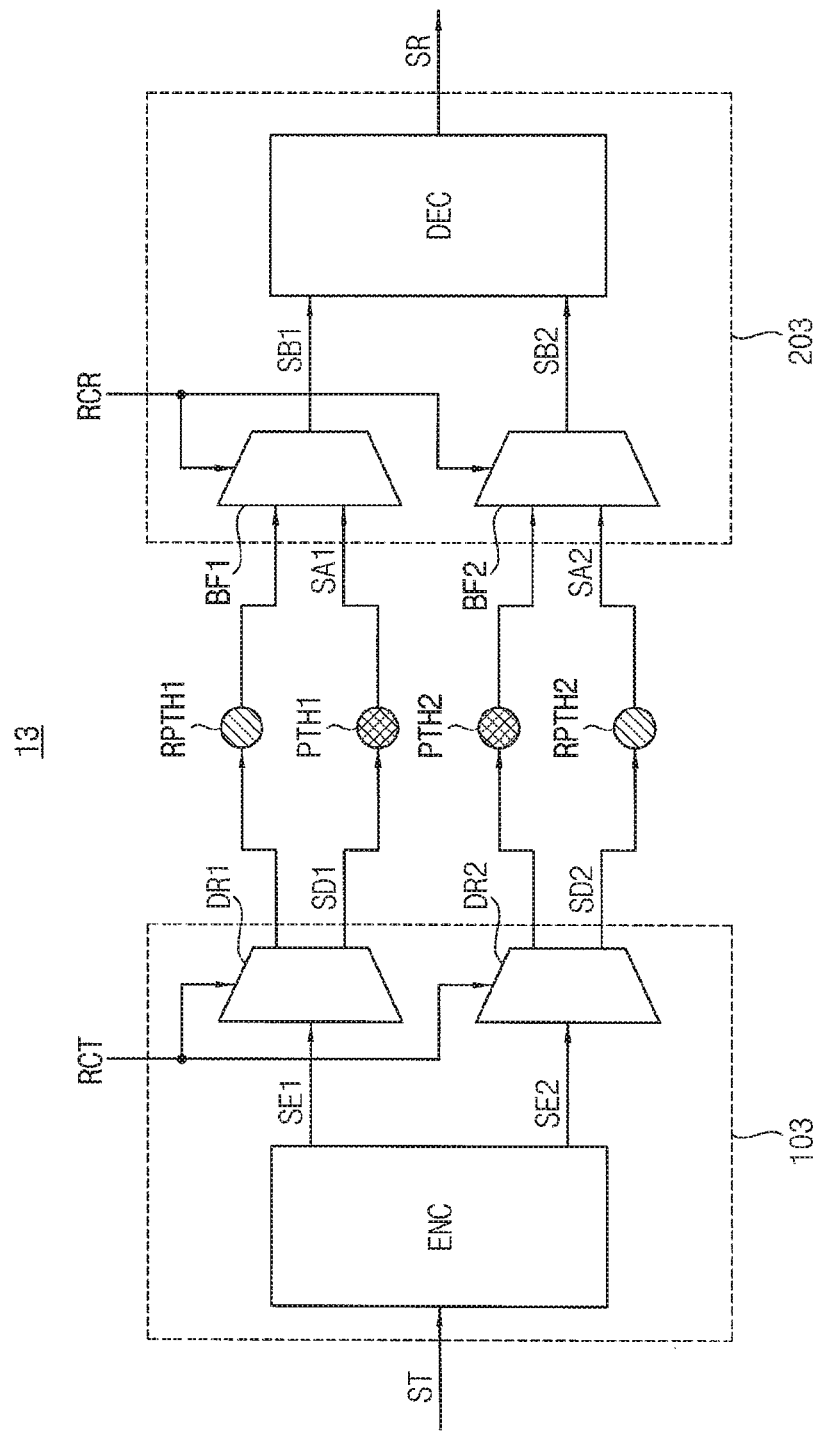
Figure 16:
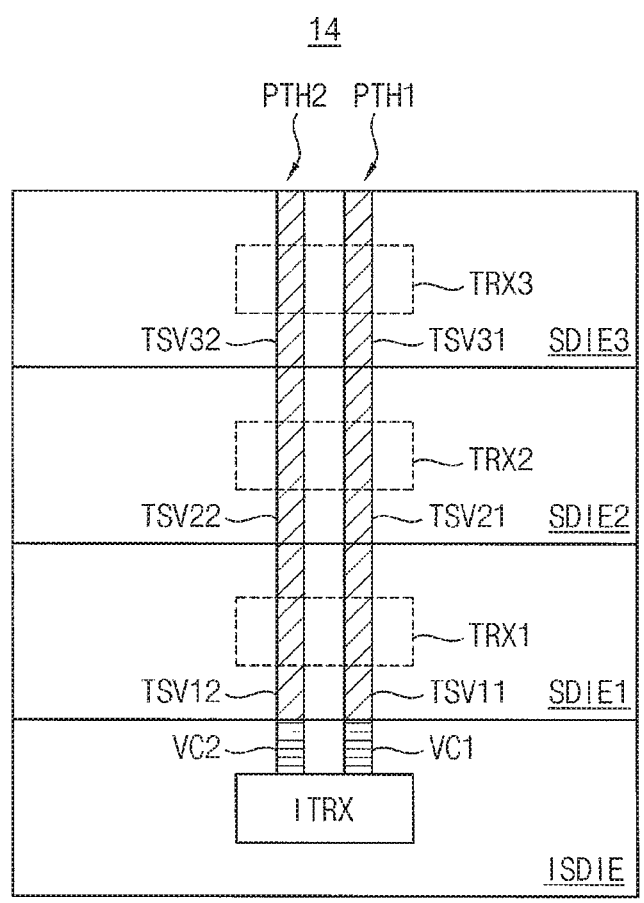

FIGS. 14, 15 and 16 are diagram illustrating stacked semiconductor devices according to example embodiments.

Referring to FIG. 14, a stacked semiconductor device 12 includes a first transceiver unit 521, a first signal path PTH1, a second signal path PTH2 and a second transceiver unit 522. The first transceiver unit 521 may include a first encoder ENC1 and a first decoder DEC1 for bi-directional communication. Also the second transceiver unit 522 may include a second encoder ENC2 and a second decoder DEC2 for bi-directional communication.

The first transceiver unit 521 and the second transceiver unit 522 may correspond to the transceiver units TRX1, TRX2 and TRX3 in FIGS. 2 and 3, respectively. For example, to perform an interlayer signal transfer, the first transceiver unit 521 may be included in one of the semiconductor dies SDIE1, SDIE2 and SDIE3 and the second transceiver unit 522 may be included in another of the semiconductor dies SDIE1, SDIE2 and SDIE3. As described above with reference to FIGS. 2 and 3, each of the first signal path PTH1 and the second signal path PTH2 may include at least one through-substrate via for the signal transfer between the semiconductor dies SDIE1, SDIE2 and SDIE3.

In case of the signal transfer from the first transceiver unit 521 to the second transceiver unit 522, the first transceiver unit 521 generates a first driving signal SD1 and a second driving signal SD2 in synchronization with transitioning timing of a first transmission signal ST1 using the first encoder ENC1 to output the first driving signal SD1 to the first signal path PTH1 and output the second driving signal SD2 to the second signal path PTH2. The second transceiver unit 522 receives a first attenuated signal SA1 corresponding to the first driving signal SD1 from the first signal path PTH1 and receives a second attenuated signal SA2 corresponding to the second driving signal SD2 from the second signal path PTH2. The second transceiver unit 522 generates a first reception signal SR1 corresponding to the first transmission signal ST1 based on the first attenuated signal SA1 and the second attenuated signal SA2 using the second decoder DEC2 to be provided to the internal circuit.

In case of the signal transfer from the second transceiver unit 522 to the first transceiver unit 521, the second transceiver unit 522 generates a third driving signal SD3 and a fourth driving signal SD4 in synchronization with transitioning timing of a second transmission signal ST2 using the second encoder ENC2 to output the third driving signal SD3 to the first signal path PTH1 and output the fourth driving signal SD4 to the second signal path PTH2. The first transceiver unit 521 receives a third attenuated signal SA3 corresponding to the third driving signal SD3 from the first signal path PTH1 and receives a fourth attenuated signal SA4 corresponding to the fourth driving signal SD4 from the second signal path PTH2. The first transceiver unit 521 generates a second reception signal SR2 corresponding to the second transmission signal ST2 based on the third attenuated signal SA3 and the fourth attenuated signal SA4 using the first decoder DEC1 to be provided to the internal circuit.

In some example embodiments, as described with reference to FIGS. 5 through 9, the encoders ENC1 and ENC2 may be implemented with flip-flops that generate signals toggling in synchronization with edges of the transmission signals ST1 and ST2. In some example embodiments, as described with reference to FIGS. 10 and 11, the decoders DEC1 and DEC2 may be implemented with logic gates that perform a logic operation on the buffer signals SB1, SB2, SB3 and SB4.

Referring to FIG. 15, a stacked semiconductor device 13 includes a transmission unit 103, a first signal path PTH1, a second signal path PTH2, a third signal path RPTH1, a fourth signal path RPTH2 and a reception unit 203. The transmission unit 103 and the reception unit 203 may be included in the transceiver units TRX1, TRX2 and TRX3 in FIGS. 2 and 3, respectively. For example, to perform an interlayer signal transfer, the transmission unit 103 may be included in one of the semiconductor dies SDIE1, SDIE2 and SDIE3 and the reception unit 203 may be included in another of the semiconductor dies SDIE1, SDIE2 and SDIE3. As described above with reference to FIGS. 2 and 3, each of the first signal path PTH1, the second signal path PTH2, the third signal path RPTH1 and the fourth signal path RPTH2 may include at least one through-substrate via for the signal transfer between the semiconductor dies SDIE1, SDIE2 and SDIE3.

The transmission unit 103 generates a first driving signal SD1 and a second driving signal SD2 in synchronization with transitioning timing of a transmission signal ST to output the first driving signal SD1 to one of the first signal path PTH1 and the third signal path RPTH1 and output the second driving signal SD2 to one of the second signal path PTH2 and the fourth signal path RPTH2. The reception unit 203 receives a first attenuated signal SA1 corresponding to the first driving signal SD1 from one of the first signal path PTH1 and the third signal path RPTH1 and receives a second attenuated signal SA2 corresponding to the second driving signal SD2 from one of the second signal path PTH2 and the fourth signal path RPTH2. The reception unit 203 generates a reception signal SR corresponding to the transmission signal ST based on the first attenuated signal SA1 and the second attenuated signal SA2.

The transmission unit 103 includes an encoder ENC, a first driver DR1 and a second driver DR2. The encoder ENC generates a first encoder signal SE1 and a second encoder signal SE2 in synchronization with the transitioning timing of the transmission signal ST. The first driver DR1 outputs the first driving signal SD1 corresponding the first encoder signal SE1 to one of the first signal path PTH1 and the third signal path RPTH1 in response to a repair control signal RCT. The second driver DR2 outputs the second driving signal SD2 corresponding to the second encoder signal SE2 to one of the second signal path PTH2 and the fourth signal path RPTH2. In some example embodiments, as described with reference to FIGS. 5 through 9, the encoder ENC may be implemented with flip-flops that generate signals toggling in synchronization with edges of the transmission signal ST.

The reception unit 203 includes a first reception buffer BF1, a second reception buffer BF2 and a decoder DEC. The first reception buffer BF1 receives the first attenuated signal SA1 from one of the first signal path PTH1 and the third signal path RPTH1 in response to a repair control signal RCR to generate a first buffer signal SB1. The second reception buffer BF2 receives the second attenuated signal SA2 from the second signal path PTH2 and the fourth signal path RPTH2 in response to the repair control signal RCR to generate a second buffer signal SB2. The decoder DEC generates the reception signal SR based on the first buffer signal SB1 and the second buffer signal SB2. In some example, embodiments, as described with reference to FIGS. 10 and 11, the decoder DEC may be implemented with a logic gate that performs a logic operation on the first buffer signal SB1 and the second buffer signal SB2.

The logic levels of the repair control signals RCT and RCR may be determined such that the signals may be transferred through the third signal path RPTH2 and the fourth signal path RPTH2 when at least one of the first signal path PTH1 and the second signal path PTH2 is defective. In other words, when at least one of the first signal path PTH1 and the second signal path PTH2 is defective, the first signal path PTH1 and the second signal path PTH2 may be replaced with the third signal path RPTH1 and the fourth signal path RPTH2. The repair control signals RCT and RCR may be provided from the corresponding internal circuits, respectively.

The load of the first signal path PTH1 may be substantially the same as the load of the second signal path PTH2, and the load of the third signal path RPTH1 may be substantially the same as the load of the fourth signal path RPTH2. As described above, the loads of the signal paths transferring the first and second driving signals SD1 and SD2 should have the same loads so as to maintain the duty or and the pulse width of the transmission signal ST and the reception signal SR. Even though only one of the first and second signal paths PTH1 and PTH2 is defective, both of the first and second signal paths PTH1 and PTH2 may be replaced with the third and fourth signal path RPTH1 and RPTH2 having the same loads so as to maintain the duty ratio of the transferred signal.

Referring to FIG. 16, a stacked semiconductor device 14 includes an interface semiconductor die ISDIE and a plurality of semiconductor dies SDIE1, SDIE2 and SDIE3 that are stacked on the interface semiconductor die ISDIE in a vertical direction. FIG. 16 illustrates a non-limiting example of the three stacked semiconductor dies SDIE1, SDIE2 and SDIE3, and the number of the stacked semiconductor dies may be determined variously. In some example embodiments, the semiconductor dies SDIE1, SDIE2 and SDIE3 may be memory semiconductor dies in which memory cells are integrated and the interface semiconductor die ISDIE may be an interposer for connecting the semiconductor dies SDIE1, SDIE2 and SDIE3 and an external controller.

The semiconductor dies SDIE1, SDIE2 and SDIE3 may include internal circuits (not shown), transceiver units TRX1, TRX2 and TRX3 and through-silicon vias or through-substrate vias TSV11, TSV12, TSV21, TSV22, TSV31 and TSV32, respectively. The interface semiconductor die ISDIE may include an internal circuit (not shown), vertical contacts VC1 and VC2 and a transceiver unit ITRX.

Each of signal paths PTH1 and PTH2 includes one or more through-substrate vias that are formed in the semiconductor dies SDIE1, SDIE2 and SDIE3, respectively. For example, as illustrated in FIG. 16, the first signal path PTH1 may include the three through-substrate vias TSV11, TSV21 and TSV31 respectively formed in the three semiconductor dies SDIE1, SDIE2 and SDIE3 and the vertical contact VC1 formed in the interface semiconductor die ISDIE, and the second signal path PTH2 may include the three through-substrate vias TSV21, TSV22 and TSV32 respectively formed in the three semiconductor dies SDIE1, SDIE2 and SDIE3 and the vertical contact VC2 formed in the interface semiconductor die ISDIE. Even though FIG. 16 illustrates that the two through-substrate vias in the adjacent semiconductor dies are connected directly, the through-substrate vias may be electrically connected through bumps, pads, metal wires, etc.

Each transceiver unit TRXi (i=, 1, 2, 3) and ITRX may receive one transmission signal from the internal circuit and convert or encode the one transmission signal to two signals to be transmitted to the first signal path PTH1 and the second signal path PTH2. In addition, each transceiver unit TRXi and ITRX may receive two signals from the first signal path PTH1 and the second signal path PTH2 and decode the two signals to one reception signal to be provided to the internal circuit Such signal transfer is the same as described with reference to FIGS. 4 through 13.

The transmission unit 100 and the reception unit 200 as described with reference to FIG. 4 may be included in the transceiver units TRX1, TRX2, TRX3 and ITRX in FIG. 16, respectively. In some example embodiments, to perform an interlayer signal transfer, the transmission unit 100 may be included in one of the semiconductor dies SDIE1, SDIE2 and SDIE3 and the reception unit 200 may be included in another of the semiconductor dies SDIE1, SDIE2 and SDIE3. In other example embodiments, one of the transmission unit 100 and the reception unit 200 may be included in one of the semiconductor dies SDIE1, SDIE2 and SDIE3 and the other of the transmission unit 100 and the reception unit 200 may be included in the interface semiconductor die ISDIE.

Figure 17:
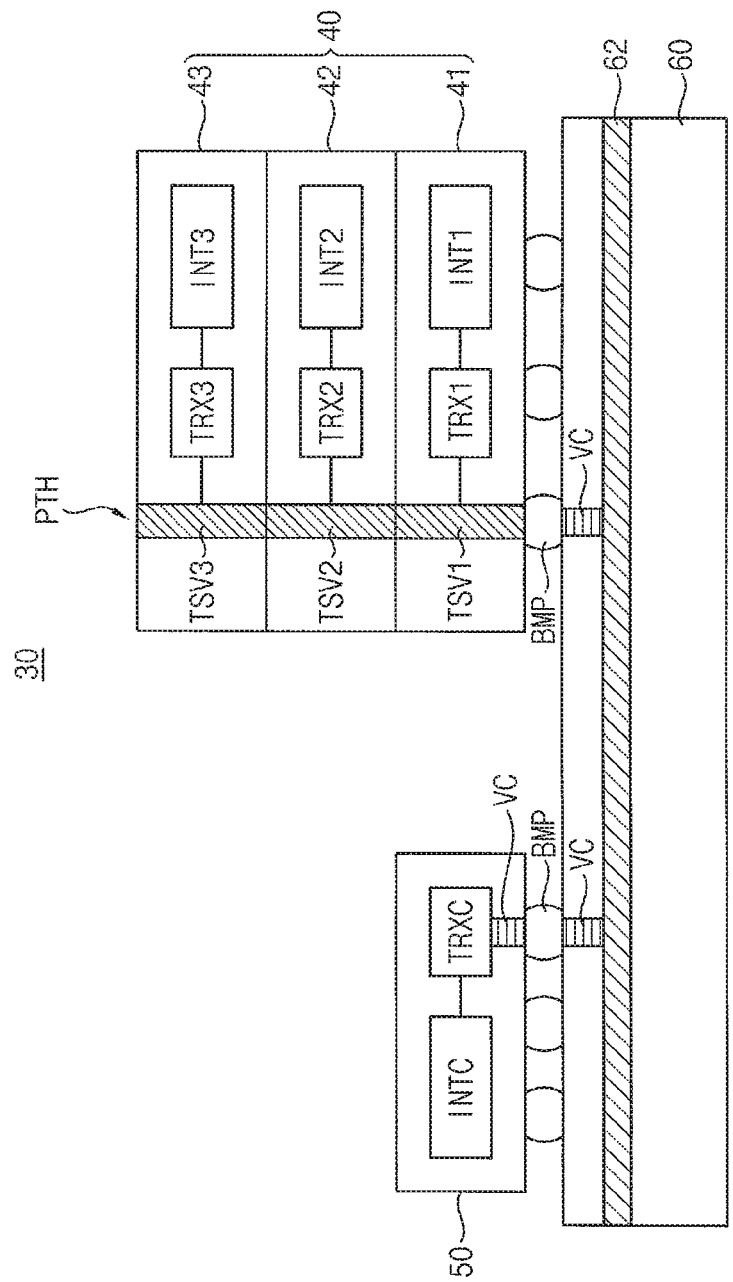
FIG. 17 is a diagram illustrating a system including a stacked semiconductor device according to example embodiments.

FIG. 17 is a diagram illustrating a system including a stacked semiconductor device according to example embodiments.

Referring to FIG. 17, a system 30 includes a base substrate 60 and a plurality of semiconductor dies 41, 42, 43 and 50 that are stacked on the base substrate 60. The stacked semiconductor dies 41, 42 and 43 may be packaged as a chip 40 and the semiconductor die 50 may be packaged as another chip. The packaged chips 40 and 50 may be mounted on the base substrate 60 using the bumps BMP, and may be electrically connected to each other through the bumps BMP, the vertical contacts VC and the signal lines 62 of the base substrate 60.

The stacked semiconductor chip 40 includes the plurality of semiconductor dies 41, 42 and 43 that are stacked in a vertical direction. FIG. 17 illustrates a non-limiting example of the three stacked semiconductor dies 41, 42 and 43, and the number of the stacked semiconductor dies in the stacked semiconductor chip 40 may be determined variously. The semiconductor dies 41, 42 and 43 may include internal circuits INT1, INT2 and INT3, transceiver units TRX1, TRX2 and TRX3 and through-silicon vias or through-substrate vias TSV1, TSV2 and TSV3, respectively. The other semiconductor die 50 may include an internal circuit INTC, a transceiver unit TRXC and vertical contacts VC.

Each signal path PTH may include the through-substrate vias TSV1, TSV2 and TSV3 formed in the semiconductor dies 41, 42 and 43, respectively. Even though FIG. 17 illustrates that the two through-substrate vias in the adjacent semiconductor dies are connected directly, the through-substrate vias may be electrically connected through bumps, pads, metal wires, etc.

Each transceiver unit TRXi (i=, 1, 2, 3) and TRXC may receive one transmission signal from the internal circuit INTi and INTC and convert or encode the one transmission signal to two signals to be transmitted to the two signal paths. In addition, each transceiver unit TRXi and TRXC may receive two signals from the two signal paths and decode the two signals to one reception signal to be provided to the internal circuit INTi and INTC. Such signal transfer is the same as described with reference to FIGS. 4 through 13.

The internal circuit INTi and INTC may include various integrated circuits according to the kind of the semiconductor chips 40 and 50. For example, the stacked semiconductor chip 40 may be a memory device and the other semiconductor chip 50 may be a memory controller. In this case, memory cells and circuits for operating the memory cells may be integrated in the internal circuits INT1, INT2 and INT3 of the semiconductor memory chip 40. The semiconductor dies 41, 42 and 43 may be homogeneous or heterogeneous.

The transmission unit 100 and the reception unit 200 as described with reference to FIG. 4 may be included in the transceiver units TRX1, TRX2, TRX3 and ITRX in FIG. 17, respectively. In some example embodiments, to perform an interlayer signal transfer, the transmission unit 100 may be included in one of the stacked semiconductor dies 41, 42 and 43 and the reception unit 200 may be included in another of the stacked semiconductor dies 41, 42 and 43. In other example embodiments, one of the transmission unit 100 and the reception unit 200 may be included in one of the stacked semiconductor dies 41, 42 and 43 and the other of the transmission unit 100 and the reception unit 200 may be included in the other semiconductor chip 50.

As such, the stacked semiconductor device, the system including the stacked semiconductor device and the method of transferring a signal according to example embodiments may perform a signal transfer efficiently even when the load of the signal path including the TSV is large, by transforming the transmission signal to the two driving signals to be transferred through the two signal paths. The stacked semiconductor device, the system including the stacked semiconductor device and the method of transferring a signal according to example embodiments may maintain the pulse width and the duty ratio of the transmission signal and the reception signal even when the pulse width of the transmission signal is narrow or the frequency of the transmission is small.

Figure 18:
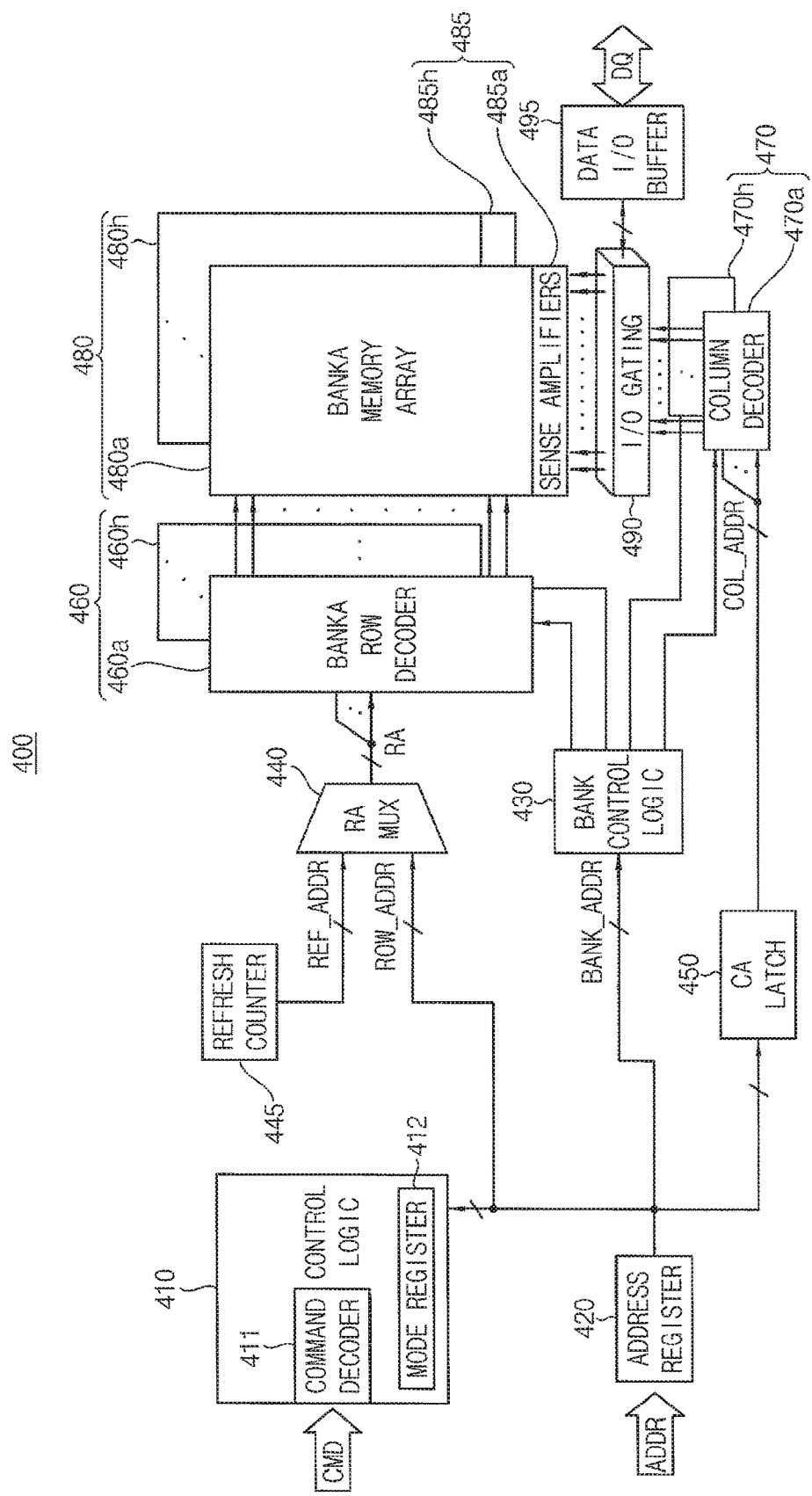
FIG. 18 is a diagram illustrating an example of an internal circuit formed in a semiconductor die.

FIG. 18 is a diagram illustrating an example of an internal circuit formed in a semiconductor die.

Referring to FIG. 18, an internal circuit 400 may correspond to a memory region or a memory device. The memory region 400 (or, alternatively, the memory device) may include a control logic 410, an address register 420, a bank control logic 430, a row address multiplexer 440, a column address latch 450, a row decoder 460, a column decoder 470, a memory cell array 480, a sense amplifier unit 485, an input/output (I/O) gating circuit 490, a data input/output (I/O) buffer 495, and a refresh counter 445.

The memory cell array 480 may include a plurality of bank arrays 480a~480h. The row decoder 460 may include a plurality of bank row decoders 460a~460h respectively coupled to the bank arrays 480a~480h, the column decoder 470 may include a plurality of bank column decoders 470a~470h respectively coupled to the bank arrays 480a~480h, and the sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR and a column address COL_ADDR from the memory controller. The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460a~460h.

The activated one of the bank row decoders 460a~460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In some embodiments, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the input/output gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by the sense amplifier 485 coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory region 400. For example, the control logic 410 may generate control signals for the memory region 400 in order to perform a write operation or a read operation. The control logic 410 may include a command decoder 411 that decodes a command CMD received from the memory controller and a mode register set 412 that sets an operation mode of the memory region 400.

For example, the command decoder 411 may generate the control signals corresponding to the command CMD by decoding a write enable signal, a row address strobe signal, a column address strobe signal, a chip selection signal, etc.

Figure 19:
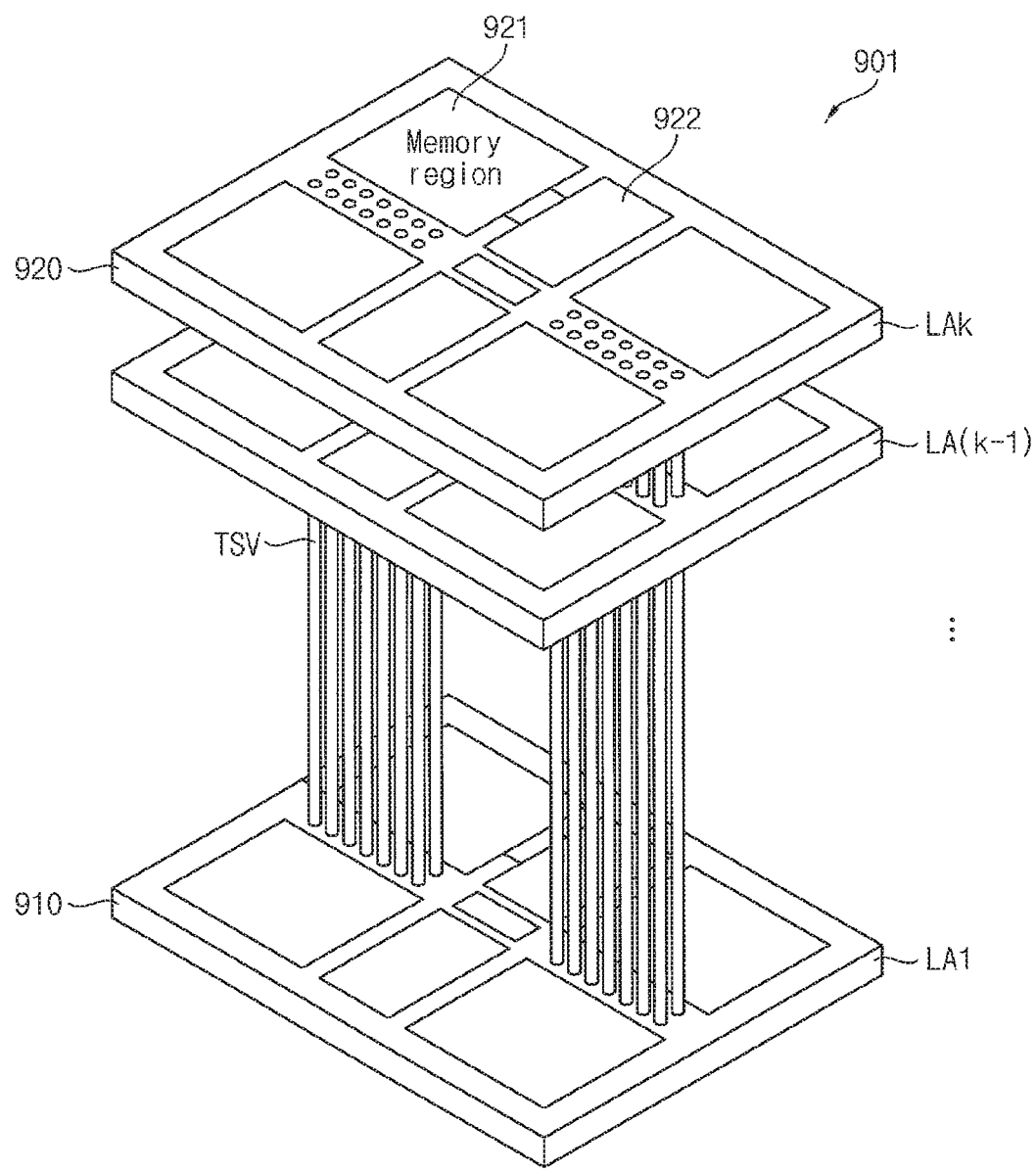
FIG. 19 is a diagram illustrating a structure of a stacked memory device according to example embodiments.

FIG. 19 is a diagram illustrating a structure of a stacked memory device according to example embodiments.

Referring to FIG. 19, a semiconductor memory device 901 may include first through kth semiconductor integrated circuit layers LA1 through LAk, in which the lowest first semiconductor integrated circuit layer LA1 may be a master layer and the other semiconductor integrated circuit layers LA2 through LAk may be slave layers.

The first through kth semiconductor integrated circuit layers LA1 through LAk may transmit and receive signals between the layers by through-substrate vias (e.g., through-silicon vias TSVs). The lowest first semiconductor integrated circuit layer LA1 as the master layer may communicate with an external memory controller through a conductive structure formed on an external surface.

The first semiconductor integrated circuit layer 910 through the kth semiconductor integrated circuit layer 920 may include memory regions 921 and various peripheral circuits 922 for driving the memory regions 921. For example, the peripheral circuits may include a row (X)-driver for driving wordlines of a memory, a column (Y)-driver for driving bit lines of the memory, a data input/output unit for controlling input/output of data, a command buffer for receiving a command from outside and buffering the command, and an address buffer for receiving an address from outside and buffering the address.

The first semiconductor integrated circuit layer 910 may further include a control logic and the control logic may generate control signals to control the memory region 921 based on the command-address signals from the memory controller.

The first semiconductor integrated circuit layer 910 through the kth semiconductor integrated circuit layer 920 may include the transmission unit and/or the reception unit as described above. According to example embodiments, the transmission signal may be transformed or encoded to two driving signals, which are transferred through two signal paths, and thus a signal transfer may be performed efficiently even when the load of the signal path including the TSV is large.

Figure 20:
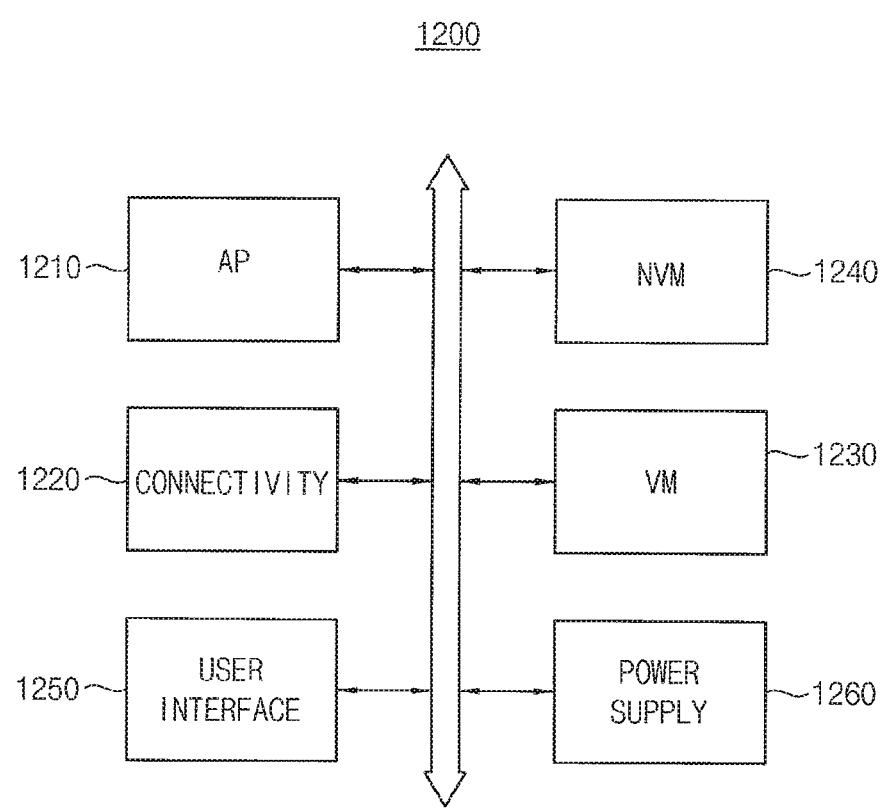
FIG. 20 is a block diagram illustrating a mobile system according to example embodiments.

FIG. 20 is a block diagram illustrating a mobile system according to example embodiments.

Referring to FIG. 20, a mobile system 1200 includes an application processor 1210, a connectivity unit 1220, a volatile memory device (VM) 1230, a nonvolatile memory device 1240, a user interface 1250, and a power supply 1260.

The application processor 1210 may execute applications such as a web browser, a game application, a video player, etc. The connectivity unit 1220 may perform wired or wireless communication with an external device. The volatile memory device 1230 may store data processed by the application processor 1210, or may operate as a working memory. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

In some embodiments, the mobile system 1200 may further include a camera image processor (CIS), and/or a storage device, such as a memory card, a solid state drive (SSD), a hard disk drive (HDD), a CD-ROM, etc.

At least one of the application processor 1210, the connectivity unit 1220, the volatile memory device (VM) 1230 and the nonvolatile memory device 1240 may include the transmission unit and/or the reception unit as described above. According to example embodiments, the transmission signal may be transformed or encoded to two driving signals, which are transferred through two signal paths, and thus a signal transfer may be performed efficiently even when the load of the signal path including the TSV is large.

As such, the stacked semiconductor device, the system including the stacked semiconductor device and the method of transferring a signal according to example embodiments may perform a signal transfer efficiently even when the load of the signal path including the TSV is large, by transforming the transmission signal to the two driving signals to be transferred through the two signal paths. The stacked semiconductor device, the system including the stacked semiconductor device and the method of transferring a signal according to example embodiments may maintain the pulse width and the duty ratio of the transmission signal and the reception signal even when the pulse width of the transmission signal is narrow or the frequency of the transmission is small.

The example embodiments of the inventive concepts may be applied to any devices and systems including a stacked structure of semiconductor dies. For example, the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the example embodiments of the inventive concepts.

What is claimed is:

1. A stacked semiconductor device comprising:
    a plurality of semiconductor dies stacked in a vertical direction;
    a first signal path and a second signal path each electrically connecting the plurality of semiconductor dies, the first signal path and the second signal path each including at least one through-substrate via (TSV);
    a transmitter configured to generate a first driving signal and a second driving signal based on a transmission signal, the transmission signal including at least one first pulse having a pulse width such that, when the first driving signal and the second driving signal are attenuated through the first signal path to generate a first attenuated signal and the second signal path to generate a second attenuated signal, respectively, each of the first attenuated signal and the second attenuated signal have a rising time and a falling time longer than the pulse width of the first pulse included in the transmission signal received by the transmitter while the first attenuated signal and the second attenuated signal swing between a first supply voltage and a second supply voltage, and to output the first driving signal and the second driving signal to the first signal path and the second signal path, respectively; and
    a receiver configured to,
        receive the first attenuated signal via the first signal path and receive the second attenuated signal via the second signal path, the first attenuated signal being based on the first driving signal and the second attenuated signal being based on the second driving signal, and
        generate a reception signal based on the transmission signal such that the reception signal includes a second pulse with the pulse width thereof equal to the pulse width of the first pulse and less than the rising time and the falling time of each of the first attenuated signal and the second attenuated signal.

2. The stacked semiconductor device of claim 1, wherein the transmitter is configured to generate the first driving signal and the second driving signal such that the first driving signal toggles in synchronization with rising edges of the transmission signal and the second driving signal toggles in synchronization with falling edges of the transmission signal.

3. The stacked semiconductor device of claim 1, wherein
    the transmission signal and the reception signal are clock signals or data strobe signals, and
    the reception signal is a delayed version of the transmission signal such that a duty ratio of the reception signal is same as a duty ratio of the transmission signal.

4. The stacked semiconductor device of claim 3, wherein the transmitter is configured to generate the first driving signal and the second driving signal based on the transmission signal such that a frequency of the first driving signal, the second driving signal, the first attenuated signal and the second attenuated signal is half of a frequency of the transmission signal and the reception signal.

5. The stacked semiconductor device of claim 1, wherein the transmitter comprises:
    an encoder configured to generate a first encoder signal and a second encoder signal in synchronization with a timing of a transition of the transmission signal;
    a first driver configured to generate the first driving signal based on the first encoder signal; and
    a second driver configured to generate the second driving signal based on the second encoder signal.

6. The stacked semiconductor device of claim 5, wherein the encoder comprises:
    a first flip-flop having a clock terminal, a data terminal, an inversion output terminal and a non-inversion output terminal, the clock terminal configured to receive the transmission signal, the data terminal connected to the inversion output terminal, and the non-inversion output terminal configured to output the first encoder signal; and
    a second flip-flop having a clock terminal, a data terminal, an inversion output terminal, and a non-inversion output terminal, the clock terminal configured to receive an inverted version of the transmission signal, the data terminal connected to the inversion output terminal, and the non-inversion output terminal configured to output the second encoder signal.

7. The stacked semiconductor device of claim 1, wherein the receiver comprises:
    a first reception buffer configured to buffer the first attenuated signal to generate a first buffer signal;
    a second reception buffer configured to buffer the second attenuated signal to generate a second buffer signal; and
    a decoder configured to generate the reception signal based on the first buffer signal and the second buffer signal.

8. The stacked semiconductor device of claim 7, wherein the decoder comprises:
    a logic gate configured to perform an exclusive OR (XOR) operation on the first buffer signal and the second buffer signal to generate the reception signal.

9. The stacked semiconductor device of claim 1, wherein the transmitter comprises:
    an encoder configured to generate the first driving signal and the second driving signal such that the first driving signal and the second driving signal toggle in synchronization with rising edges and falling edges of the transmission signal, respectively.

10. The stacked semiconductor device of claim 9, wherein the receiver comprises:
    a decoder configured to perform an XOR operation on the first attenuated signal and the second attenuated signal to generate the reception signal.

11. The stacked semiconductor device of claim 1, wherein the transmitter is included in a first semiconductor die of the plurality of semiconductor dies, and the receiver is included in a second semiconductor die of the plurality of semiconductor dies.

12. The stacked semiconductor device of claim 1, further comprising:
- a third signal path and a fourth signal path electrically connecting the plurality of semiconductor dies, each of the third signal path and the fourth signal path including at least one TSV; and
- at least one internal circuit configured to generate a repair control signal, if at least one of the first signal path and the second signal path is defective, the repair control signal instructing the stacked semiconductor device to replace the first signal path and the second signal path with the third signal path and the fourth signal path, respectively.

13. A system comprising:
- a base substrate;
- a plurality of semiconductor dies stacked on the base substrate in a vertical direction;
- a first signal path and a second signal path electrically connecting the plurality of semiconductor dies, each of the first signal path and the second signal path including at least one through-substrate via (TSV);
- a transmitter configured to generate a first driving signal and a second driving signal based on a transmission signal, the transmission signal including at least one first pulse having a pulse width such that, when the first driving signal and the second driving signal are attenuated through the first signal path to generate a first attenuated signal and the second signal path to generate a second attenuated signal, respectively, each of the first attenuated signal and the second attenuated signal have a rising time and a falling time longer than the pulse width of the first pulse included in the transmission signal received by the transmitter while the first attenuated signal and the second attenuated signal swing between a first supply voltage and a second supply voltage, and to output the first driving signal and the second driving signal to the first signal path and the second signal path, respectively; and
- a receiver configured to,
  - receive the first attenuated signal via the first signal path and receive the second attenuated signal via the second signal path, the first attenuated signal being based on the first driving signal and the second attenuated signal being based on the second driving signal, and
  - generate a reception signal corresponding to the transmission signal such that the reception signal includes a second pulse with the pulse width thereof equal to the pulse width of the first pulse and less than the rising time and the falling time of each of the first attenuated signal and the second attenuated signal.

14. The system of claim 13, wherein the transmitter is configured to generate the first driving signal and the second driving signal such that the first driving signal toggles in synchronization with rising edges of the transmission signal and the second driving signal toggles in synchronization with falling edges of the transmission signal.

15. A stacked semiconductor device comprising:
- a first semiconductor die including a first transceiver, the first transceiver configured to transmit a first driving signal and a second driving signal to a first through-substrate via (TSV) and a second TSV, respectively, the first driving signal and the second driving signal being based on a transmission signal, the transmission signal including at least one first pulse having a pulse width such that, when the first driving signal and the second driving signal are attenuated through the first TSV and the second TSV to generate attenuated versions thereof, the attenuated versions of the first driving signal and the second driving signal have rising and falling times longer than the pulse width of the first pulse included in the transmission signal received by the first transceiver while the attenuated versions of the first driving signal and the second driving signal swing between a first supply voltage and a second supply voltage; and
- a second semiconductor die connected to the first semiconductor die via the first TSV and the second TSV, the second semiconductor die including a second transceiver, the second transceiver configured to,
  - receive the attenuated versions of the first driving signal and the second driving signal via the first TSV and the second TSV, respectively, and to
  - generate a reception signal based on the attenuated versions of the first driving signal and the second driving signal such that a duty cycle of the reception signal generated by the second transceiver is same as a duty cycle of the transmission signal received by the first transceiver such that the reception signal includes a second pulse with the pulse width thereof equal to the pulse width of the first pulse and less than the rising and falling times of the attenuated versions of the first driving signal and the second driving signal.

16. The stacked semiconductor device of claim 15, wherein the first transceiver is further configured to generate the first driving signal and the second driving signal such that the first driving signal and the second driving signal toggle in synchronization with rising edges and falling edges of the transmission signal, respectively, and a frequency of each of the first driving signal and the second driving signal is half of a frequency of the transmission signal.

17. The stacked semiconductor device of claim 15, wherein
- the first transceiver includes at least a transmitter, the transmitter including,
  - an encoder configured to generate a first encoder signal and a second encoder signal in synchronization with a timing of a transition of the transmission signal,
  - one or more drivers configured to generate the first driving signal and the second driving signal based on the first encoder signal and the second encoder signal, respectively; and
- the second transceiver includes at least a receiver, the receiver including,
  - one or more reception buffers configured to buffer the attenuated versions of the first driving signal and the second driving signal to generate a first buffer signal and a second buffer signal, respectively, and
  - a decoder configured to generate the reception signal based on the first buffer signal and the second buffer signal.

18. The stacked semiconductor device of claim 15, wherein the stacked semiconductor device is configured to transmit the transmission signal between first semiconductor die and the second semiconductor die while maintaining a same pulse width and a duty ratio between the transmission signal and the reception signal irrespective of a size of the pulse width of the transmission signal and a frequency of the transmission signal.

* * * * *